(12) United States Patent
Antoni et al.

(10) Patent No.: US 6,840,640 B2
(45) Date of Patent: Jan. 11, 2005

(54) MULTI MIRROR SYSTEM FOR AN ILLUMINATION SYSTEM

(75) Inventors: Martin Antoni, Aalen (DE); Isabel Escudero-Sanz, Nootdorp (NL); Wolfgang Singer, Aalen (DE); Johannes Wangler, Königsbronn (DE); Jörg Schultz, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/060,909

(22) Filed: Jan. 30, 2002

(65) Prior Publication Data

US 2003/0076607 A1 Apr. 24, 2003

Related U.S. Application Data

(63) Continuation of application No. PCT/EP00/07258, filed on Jul. 28, 2000.

(30) Foreign Application Priority Data

Jul. 30, 1999 (DE) .......................................... 199 35 568
Sep. 9, 1999 (DE) ..................................... 299 15 847 U

(51) Int. Cl.$^7$ .............................. G02B 5/10; G21K 5/00
(52) U.S. Cl. ........................ 359/858; 359/859; 359/861; 374/34; 374/145
(58) Field of Search ................................ 359/351, 851, 359/857, 858, 859, 861; 378/34, 35, 145

(56) References Cited

U.S. PATENT DOCUMENTS

| 4,294,538 A | * | 10/1981 | Ban |
| 4,572,659 A | | 2/1986 | Omata .......................... 355/67 |
| 5,222,112 A | | 6/1993 | Terasawa et al. ............. 378/34 |
| 5,311,565 A | * | 5/1994 | Horikawa |
| 5,339,346 A | * | 8/1994 | White |
| 5,439,781 A | * | 8/1995 | MacDowell et al. |
| 5,512,759 A | * | 4/1996 | Sweatt |
| 5,581,605 A | | 12/1996 | Murakami et al. ............ 378/84 |
| 5,669,708 A | | 9/1997 | Mashima et al. ........... 362/341 |
| 5,677,939 A | | 10/1997 | Oshino ......................... 378/34 |
| 5,993,010 A | | 11/1999 | Ohzawa et al. ............... 353/99 |
| 5,995,582 A | | 11/1999 | Terashima et al. ............ 378/34 |
| 6,118,577 A | * | 9/2000 | Sweatt et al. |
| 6,128,364 A | * | 10/2000 | Niemann |
| 6,186,632 B1 | * | 2/2001 | Chapman et al. |
| 6,198,793 B1 | * | 3/2001 | Schultz et al. |
| 6,285,737 B1 | * | 9/2001 | Sweatt et al. |
| 6,398,374 B1 | * | 6/2002 | Chapman et al. |
| 6,400,794 B1 | * | 6/2002 | Schultz et al. |

FOREIGN PATENT DOCUMENTS

| DE | 19903807 A1 | 11/1999 |
| EP | 0066295 B1 | 12/1982 |
| EP | 0939341 A2 | 9/1999 |
| EP | 0985976 A2 | 3/2000 |
| EP | 1026547 A2 | 8/2000 |
| GB | 2217036 | * 10/1989 |
| WO | WO99/57732 | 11/1999 |

OTHER PUBLICATIONS

"Illumination Optics Design for EUV–Lithography", M. Antoni et al, SPIE vol. 4146, p25–34 (Aug. 3, 2000).

* cited by examiner

Primary Examiner—Ricky D. Shafer
(74) Attorney, Agent, or Firm—Ohlandt, Greeley, Ruggiero & Perle, LLP

(57) ABSTRACT

There is provided a multi-mirror system for an illumination system with wavelengths $\leq$193 nm. The multi-mirror system includes (a) an imaging system having a first mirror and a second mirror, (b) an object plane, (c) an image plane in which the imaging system forms an image of an object, and (d) an arc-shaped field in the image plane, where a radial direction in a middle of the arc-shaped field defines a scanning direction. The first and second mirrors are arranged such that an edge sharpness of the arc-shaped field is smaller than 5 mm in the scanning direction. Rays traveling from the object plane to the image plane impinge a used area of the first and second mirrors with incidence angles relative to a surface normal of the mirrors $\leq$30° or $\geq$60°.

9 Claims, 26 Drawing Sheets

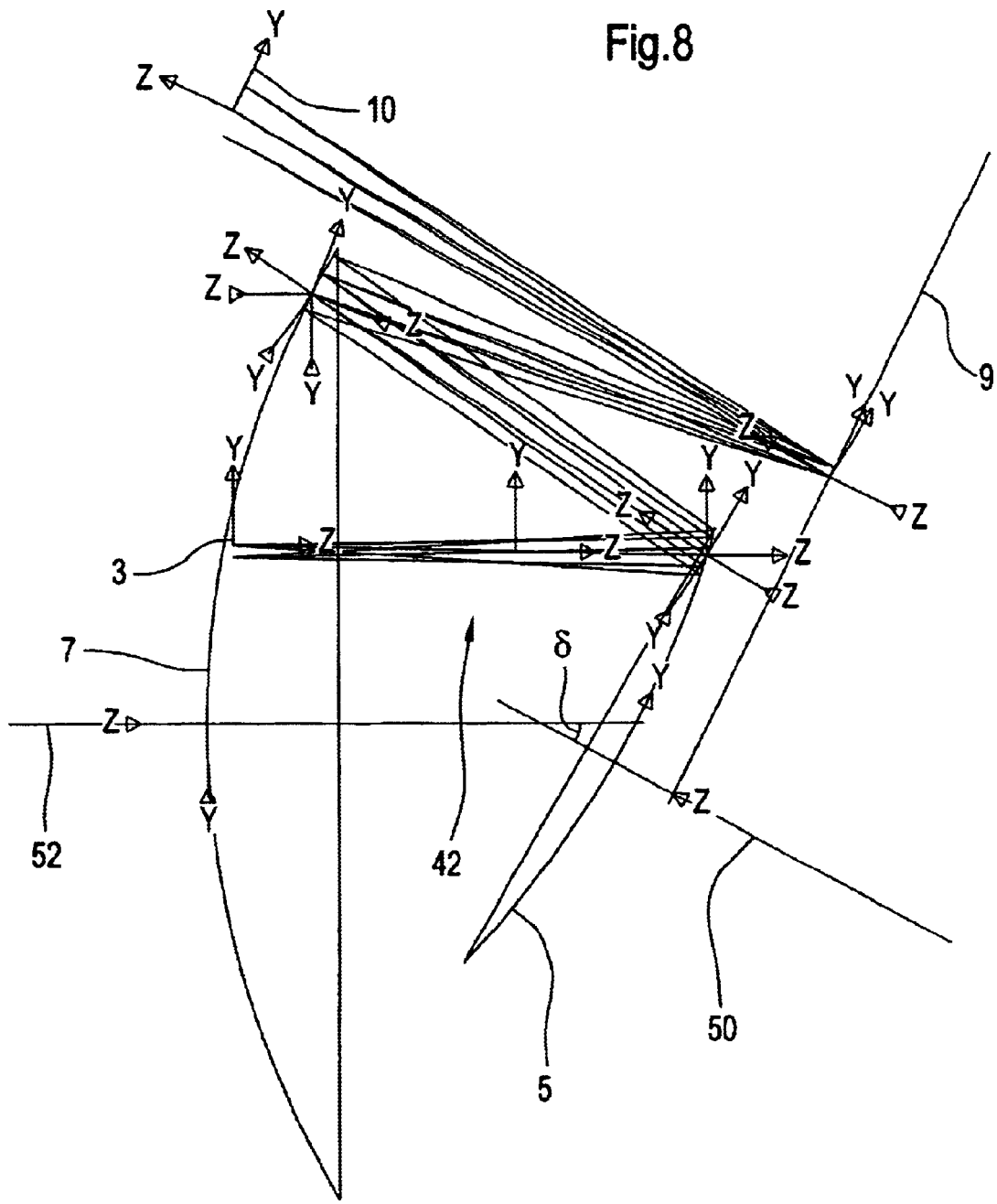

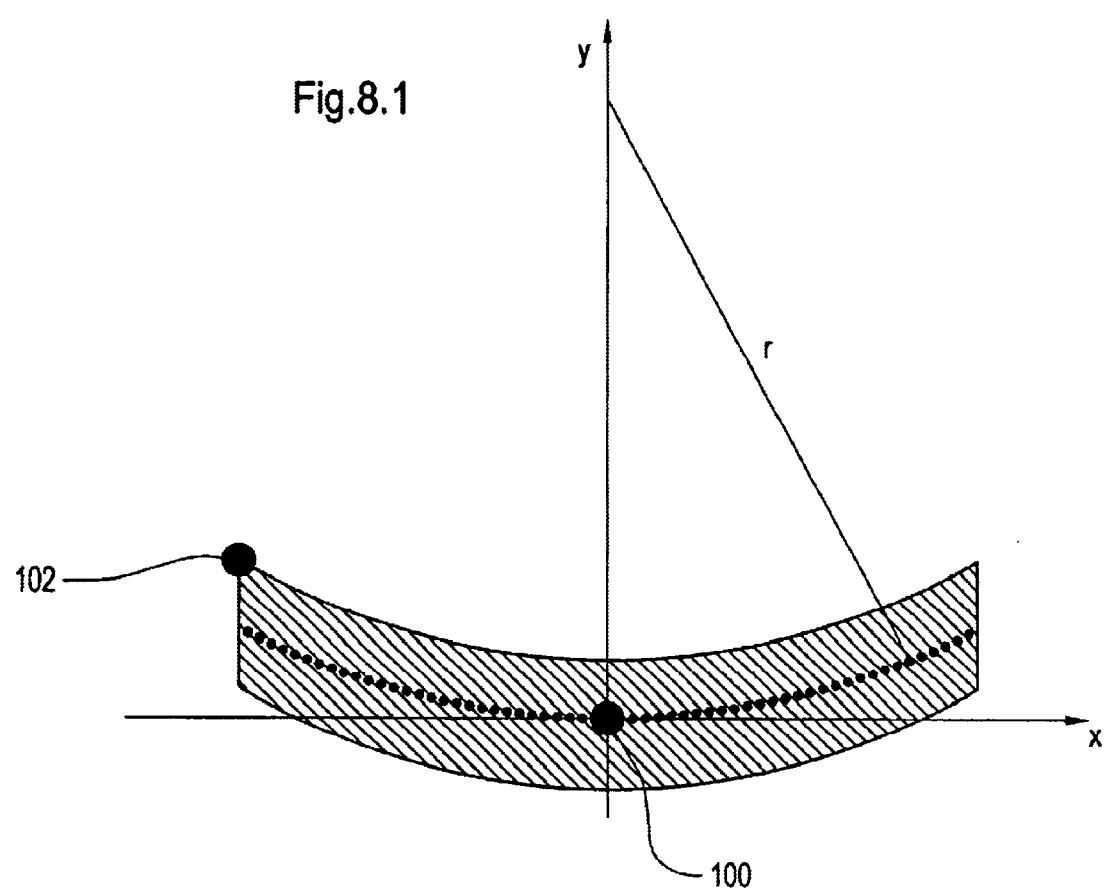

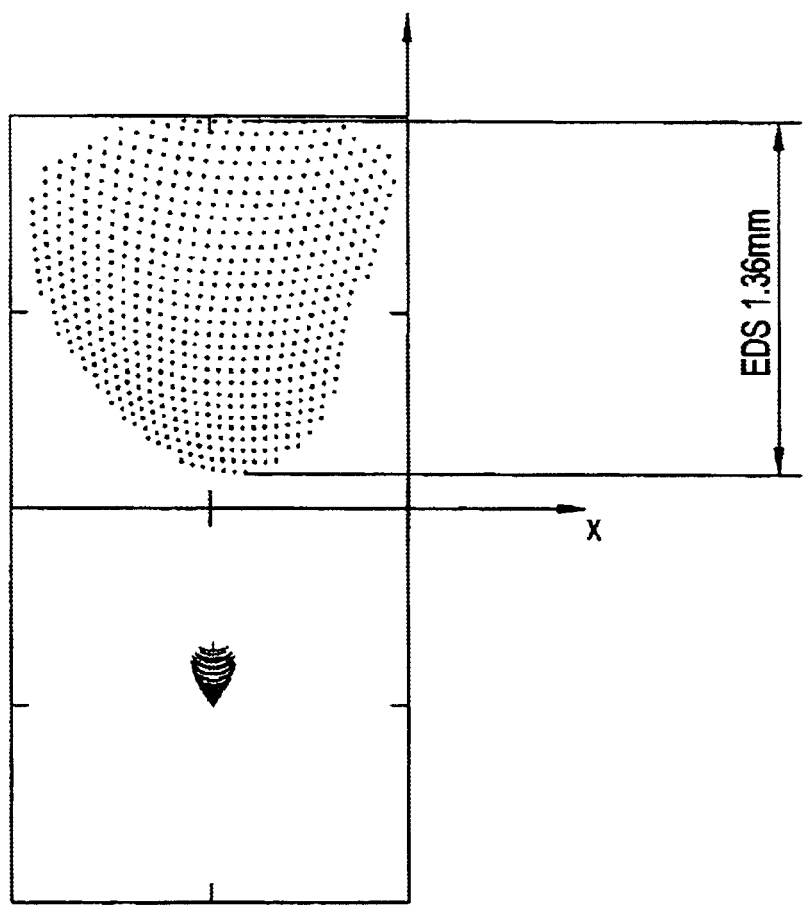
Fig.8.3
Fig.8.2

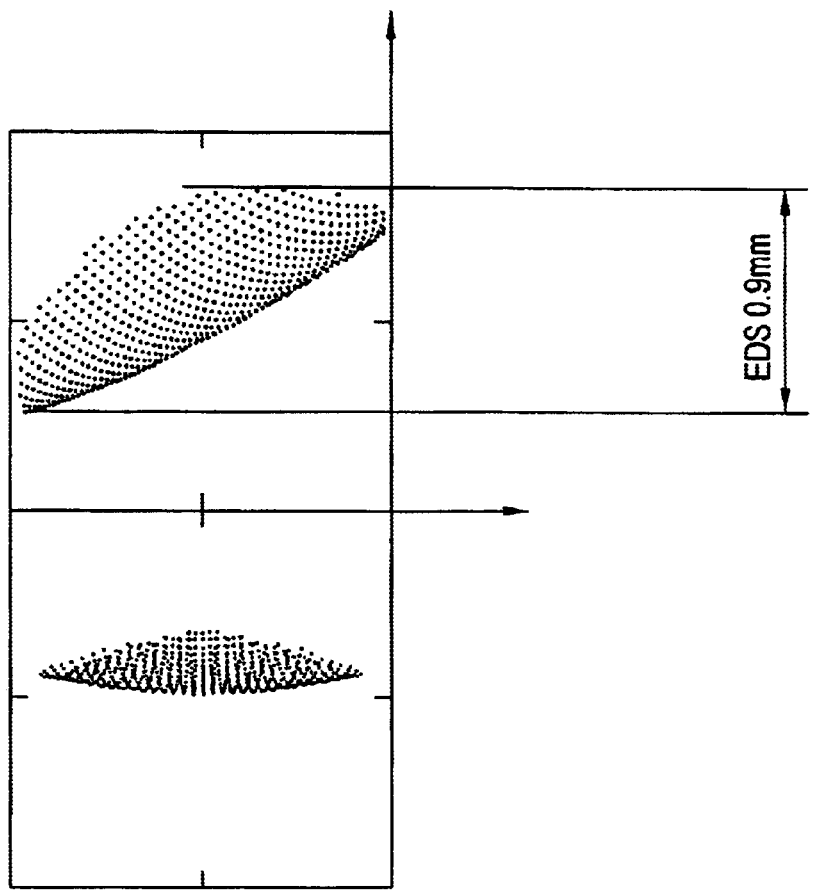

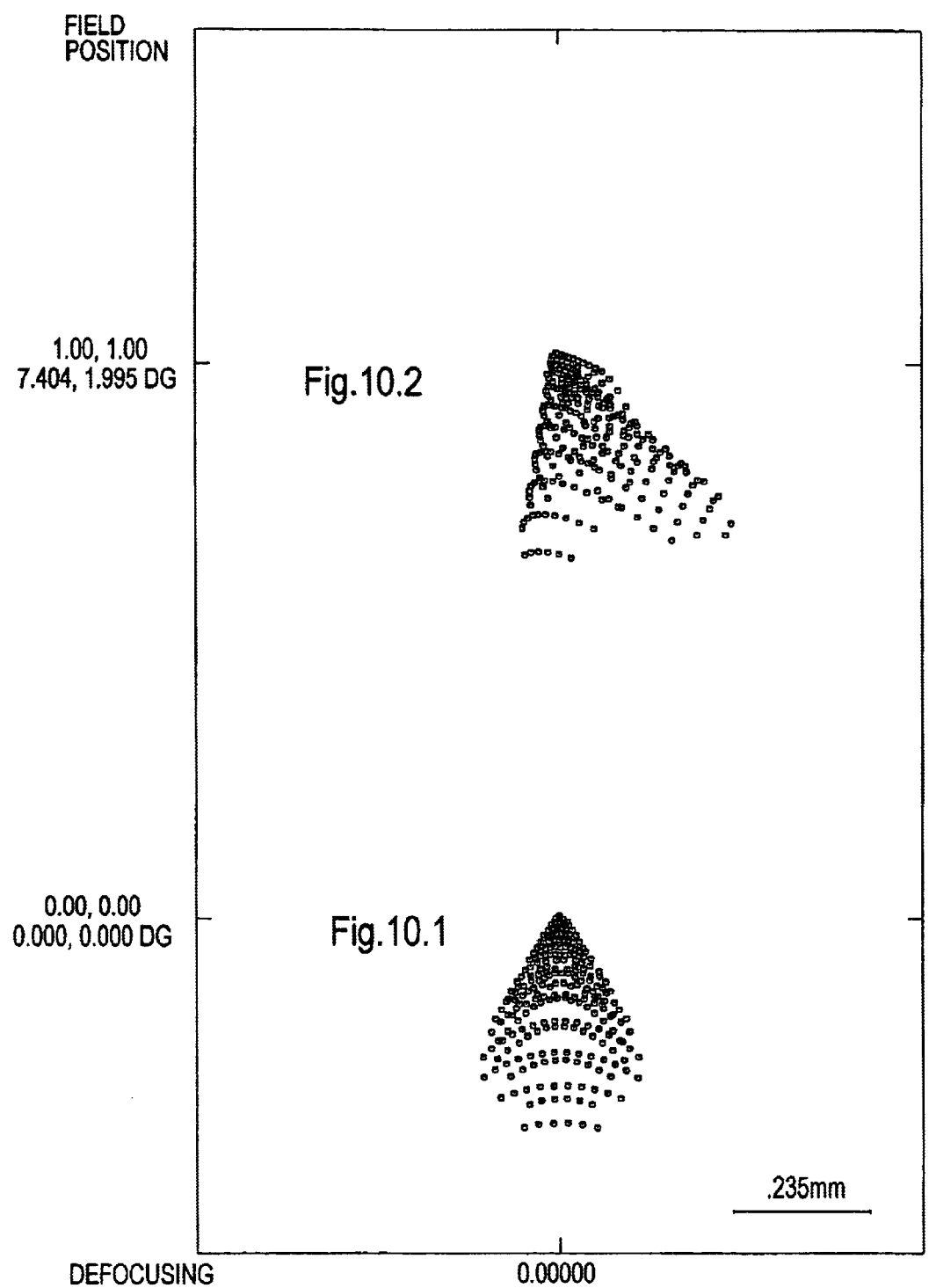

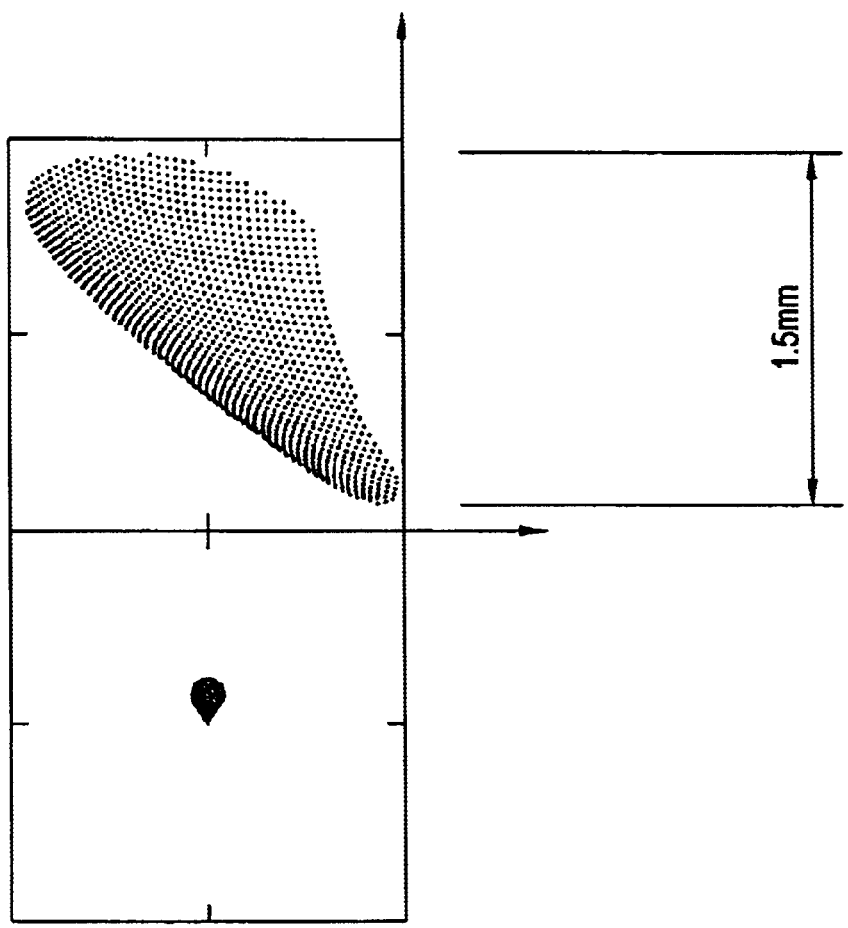

Figure 13:
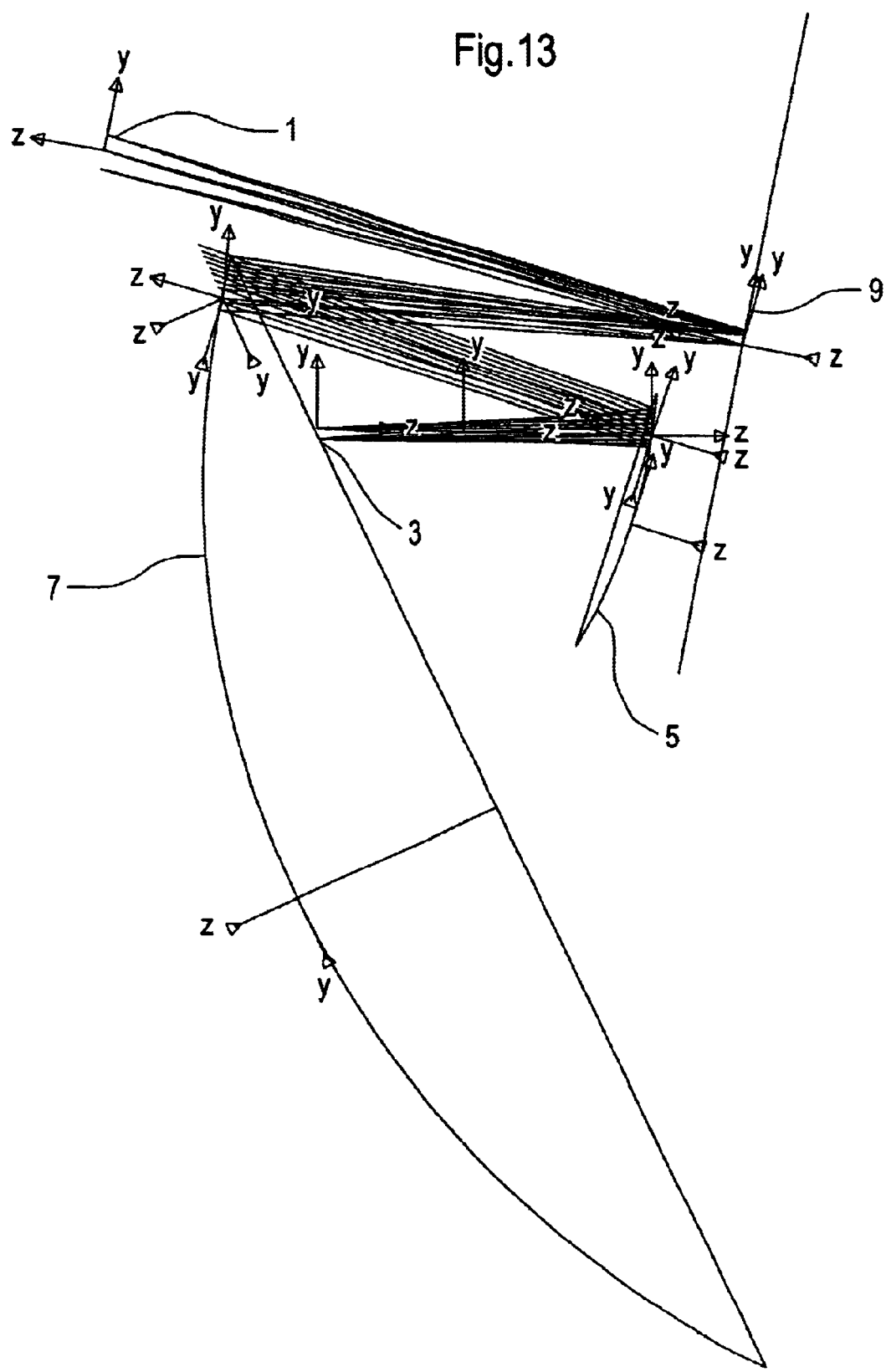

Fig. 13.2
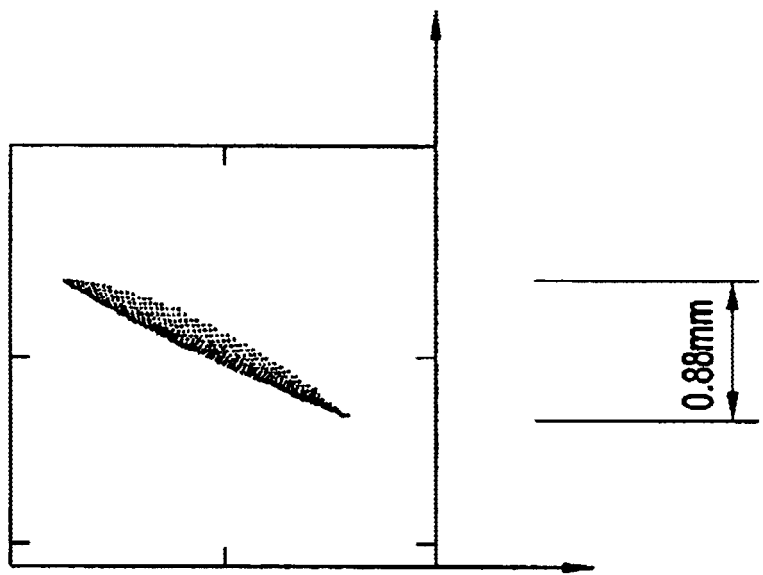
Fig. 13.1
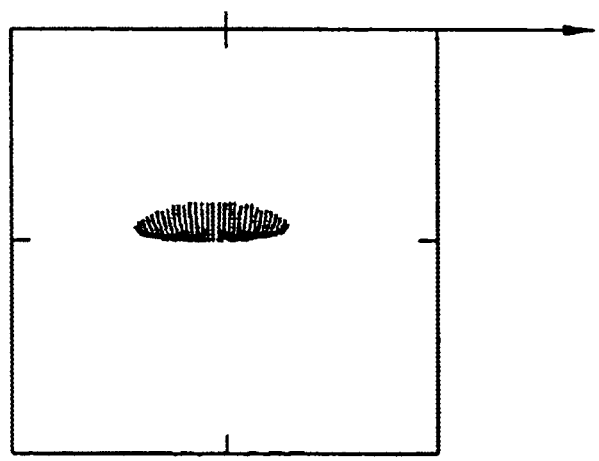

Figure 17:
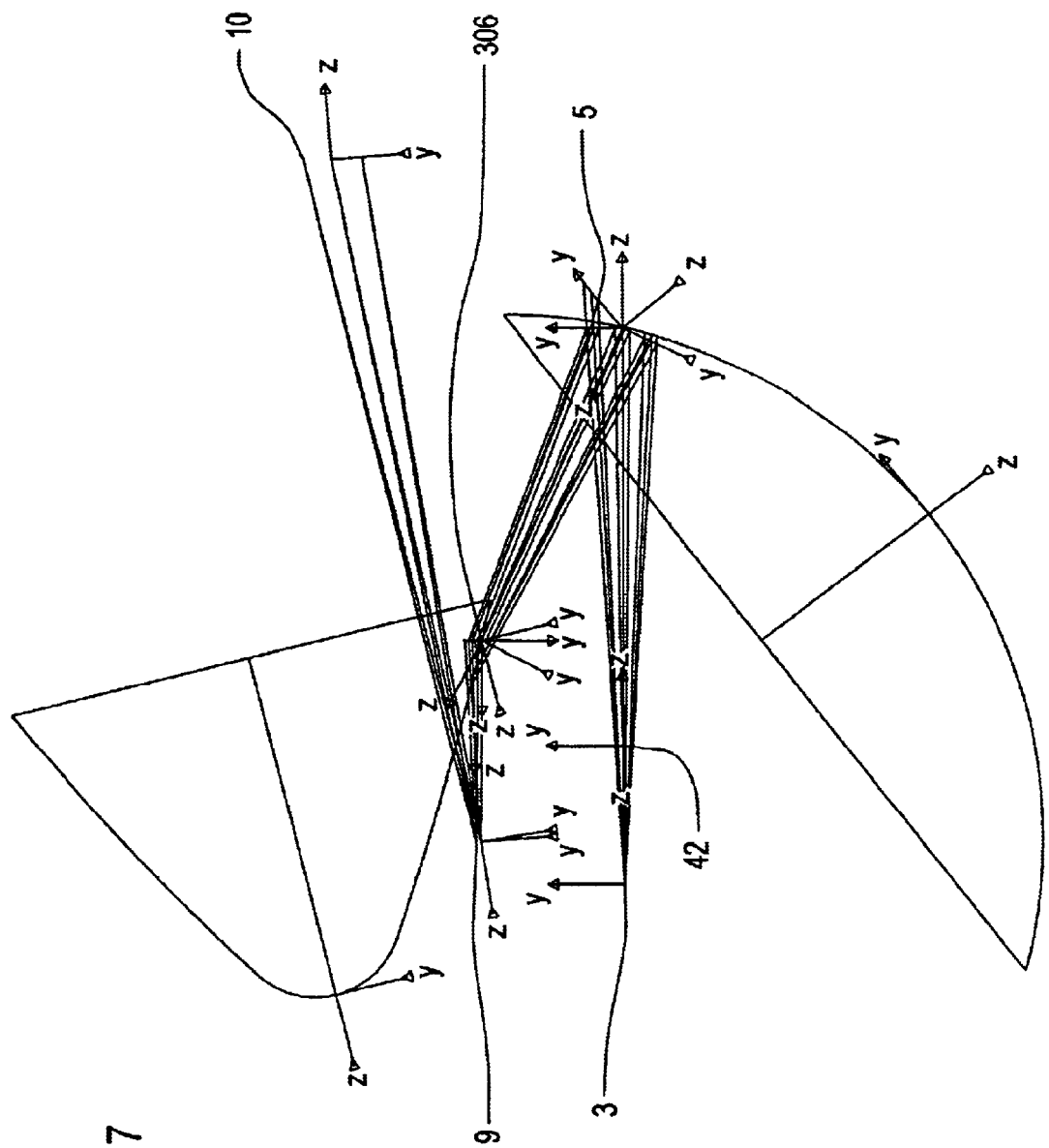

Fig.17.1
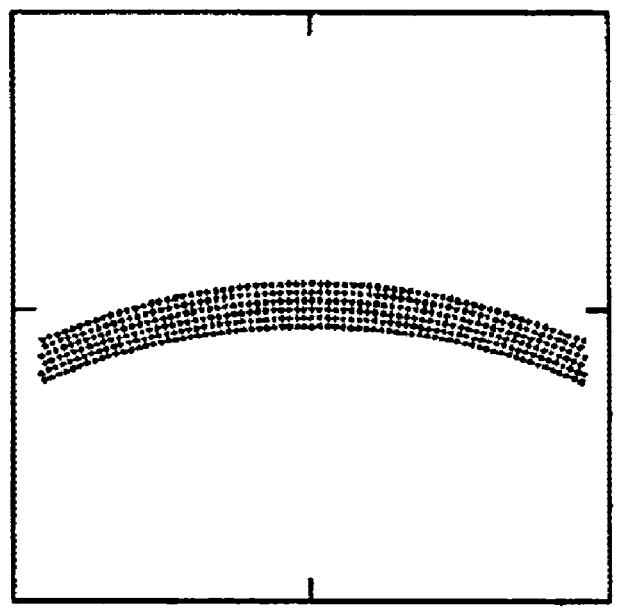

Figure 18:
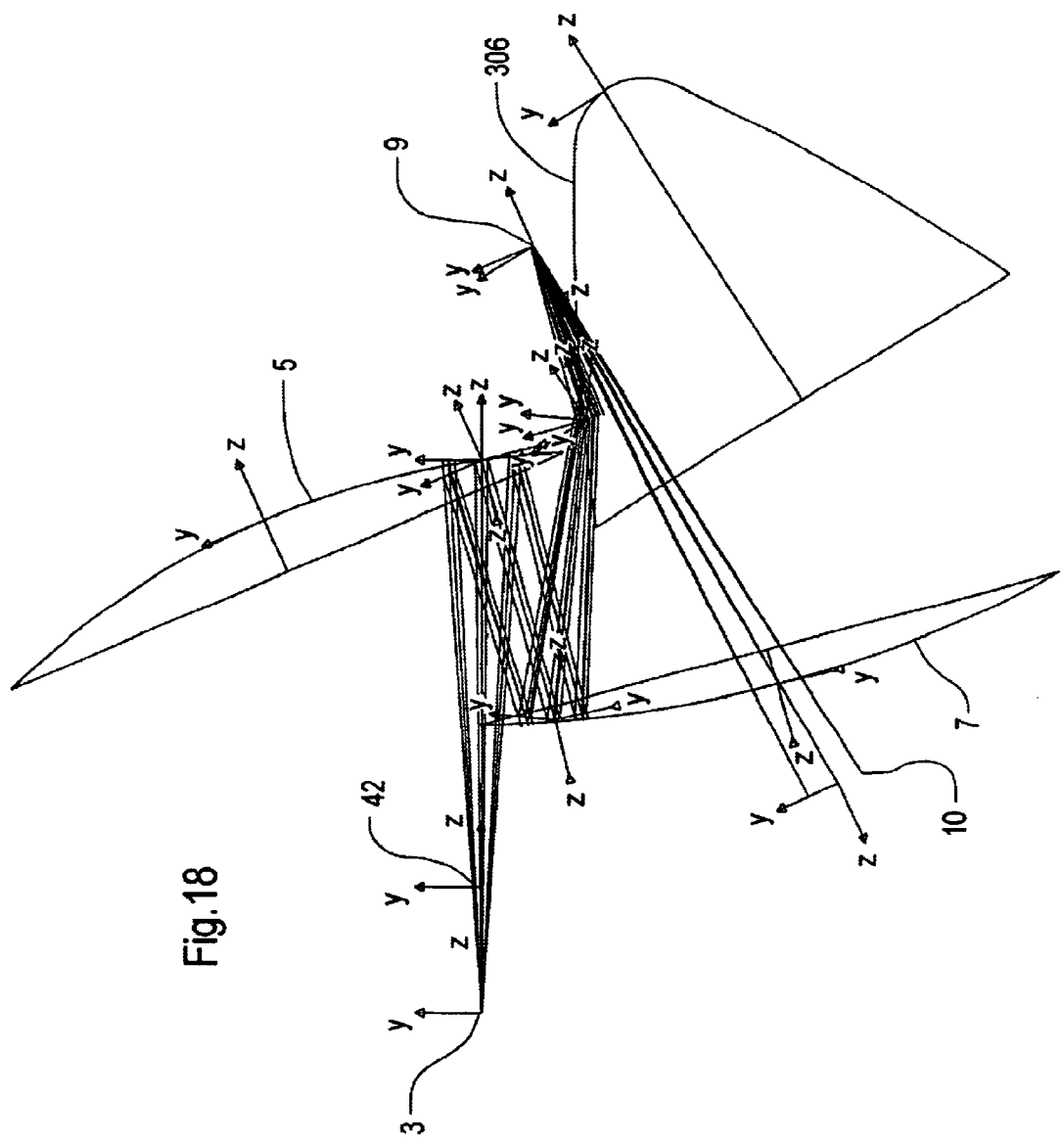

Fig.18.1
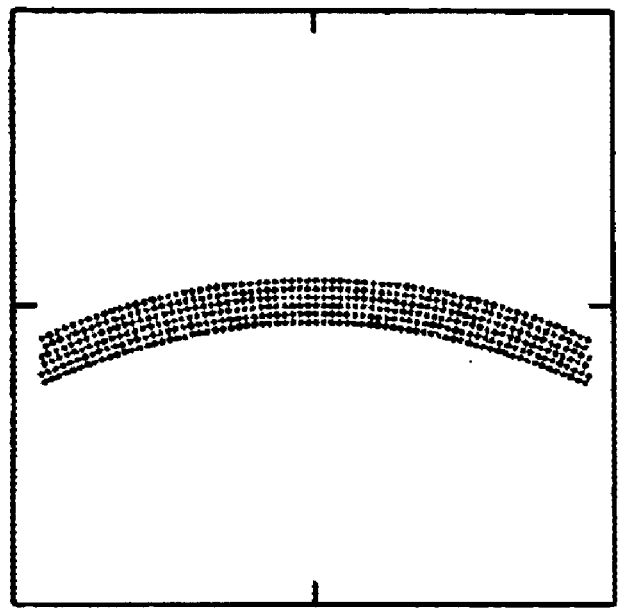

MULTI MIRROR SYSTEM FOR AN ILLUMINATION SYSTEM

CROSS REFERENCE TO RELATED APPLICATIONS

The present application is a continuation of PCT/EP00/07258, which was filed on Jul. 28, 2000. PCT/EP00/07258 claimed priority of German Patent Application Serial No. 199 35,568.1, filed on Jul. 30, 1999, and German Patent Application Serial No. 299 15 847.0, filed on Sep. 9, 1999.

The invention relates to a multi-mirror-system for an illumination system, especially for lithography with wavelengths $\leq 193$ nm comprising an imaging system.

EUV-lithography constitutes one of the most promising candidates for next generation lithography. The evolution of semiconductor fabrication demands reduced feature sizes of 50 nm and beyond. This resolution is obtained by the application of a short wavelength of 13.5 nm and moderate numerical apertures of 0.2 to 0.3. The image quality of the lithography system is determined by the projection optics as well as by the performance of the illumination system. Illumination system design is one of the key challenges of EUV lithography. In today's lithographic systems, the illuminator has to deliver invariant illumination across the reticle field. For EUV, several additional requirements have to be addressed.

EUV imaging systems need to be realized as reflective optical systems. For this reason, an unobscured pupil and a highly corrected image field can only be achieved in a small radial range of the image. Hence the field shape is a ring-field with high aspect ratio of typically 2 mm (width)× 22–26 mm (arc length) at wafer level. The projection systems operates in scanning mode.

EUV illumination systems will in general be non-centred systems formed by off-axis segments of aspherical mirrors. The reflectivity of multilayer-coated surfaces is approximately 70% for normal incidence and 90% for grazing incidence. In order to maximize throughput, the number of reflections has to be minimized and grazing incidence elements should be used whenever possible.

In order to achieve the requirements of the illumination system with a limited number of optical components, the complexity of the components has to be increased. Consequently, the surfaces will be segmented or aspherical. The shape and size of aspherical mirrors and segmented elements, together with stringent requirements for the surface quality put a major challenge on manufacturing these components.

Several EUV-light sources are currently being discussed. They differ in system aspects, but also in important illuminator-related aspects. System aspects are e.g. output power, repetition rate, footprint. For the illumination system size and divergence of the radiating plasma, radiation characteristics and geometrical vignetting are relevant. The illumination design has to account for these properties.

It is well known from basic physics that the étendue is invariant in optical systems. The étendue delivered by the source has to be smaller than the étendue of the illuminator, otherwise light will be lost For current sources, however, the étendue is approximately one order of magnitude smaller, therefore either field or pupil of the optical system is not filled completely. In addition, the ring-field with high aspect ratio requires an anmorphotic étendue, which has to be formed by the illuminator.

According to Helmholtz-Lagrange, the product of field A and numerical aperture NA is invariant in classical optical systems. For unobscured and circular pupils the Helmholtz-Lagrange-invariant HLI or étendue can be written as:

$$\text{étendue} = A \cdot \pi \cdot NA^2 \quad (1)$$

In general, the invariance of the étendue can be interpreted as the optical equivalent to the invariance of the phase space volume in conservative systems. The étendue can be written as a volume integral in four dimensions, $$\text{étendue} = \int F(x, y, P_x, P_y) \, dx\,dy\,dP_x\,dP_y \quad (2)$$

with the function F describing the occupied volume in phase space and $$\vec{P} = (n \sin\theta \cos\phi, n \sin\theta \sin\phi, n\cos\theta)$$

the vector of optical direction cosines, which corresponds to the pupil coordinates.

For centred systems, the optical direction cosine integration in equation (2) can be written in polar coordinates $(\theta,\phi)$:

$$\text{étendue} = \int F(x, y, \theta, \varphi) dA \left| \frac{\partial(P_x, P_y)}{\partial(\theta, \varphi)} \right| d\theta d\varphi \quad (3)$$
$$= \int F(x, y, \theta, \varphi) dA \sin\theta\cos\theta\, d\theta d\varphi$$

The illumination field at the reticle is arc-shaped with dimensions of approx. 8 mm×88 mm. Thus the étendue to be provided by the illumination system has to be almost isotropic in angular domain, but highly anamorphotic in space domain with an aspect ration of 1:10. The different light sources, however, show an almost isotropic behaviour in space as well as in angular domain. In addition, the étendue of all known light sources is too small, although an optimum collection efficiency is assumed. In EUV illumination systems it is therefore essential to transform the étendue of the light source without changing the isotropy in angular domain. Array elements offer the most promising methods to transform the étendue . With optical array elements the field formation with high aspect ratio as well as the filling of the required aperture can be achieved.

The étendue is not increased, but only transformed by the introduction of a segmentation in the entrance pupil. Examples for array elements are the ripple-plate (an array of cylindrical lenses) and the fly's eye-integrator. Both are capable of forming a field with high aspect ratio and introduce a segmentation in the entrance pupil. Partial coherent image simulations show that the influence of the segmentation of the pupil can be tolerated, as far as a reasonable number of segments is chosen. Illumination systems with fly's-eye integrator are described in DE 199 03 807 A1 and WO 99/57732, the content of said applications is incorporated herein by reference.

Illumination systems with ripple plates are known from Henry N. Chapman, Keith A. Nugent, "A novel Condensor for EUV Lithography Ring-Field Projection Optics", Proceedings of SPIE 3767, pp. 225–236, 1999.

The content of said article is also fully incorporated herein by reference.

The illumination system has to be combined with the lens system and it has to meet the constraints of the machine layout. The mechanical layout of non-centred reflective systems strongly depends on the number of mirrors and the folding angles. Within this setup, the mirrors and special components must be mounted with tight tolerances. Heat load and natural frequencies of the frame structure have to be considered.

In EUV, each reflection will suffer from 30% light loss. The light is absorbed or dissipated leading to a heating of the mirrors. To avoid deformations of the optical elements as well as the mechanical structure, a cooling of mirrors is required. This is especially challenging because the complete optical system has to be under vacuum and hence only conduction can be used for cooling.

Furthermore in an illumination system for lithography it is desirable to introduce means for cutting off the field e.g. by a field stop.

An illumination system for lithography with a field stop is shown in U.S. Pat. No. 4, 294,538. The content of said document is incorporated herein fully by reference. The system according to U.S. Pat. No. 4,294,538 comprises a slit plate on which an arcuate image of the light source is formed. By varying the radial length and the length in direction of the circular arc of the opening of the slit it is possible to adjust the radial length and the length in the direction of the circular arc of the arcuate image of the light source on a mask. Therefore the slit plate can also be designated as a field stop. Between the slit plate and the mask there are two mirrors arranged for imaging the arc-shaped field in the plane of the slit plate onto a reticle-mask.

Since the illumination system known from U.S. Pat. No. 4,294,538 is designed for a light source comprising a ultra high tension mercury lamp emitting light in the visible region the system is totally different to a illumination system for wavelengths $\leq 193$ nm.

For example said system has no means for enhancing the étendue of the light source e.g. by raster elements of a fly's-eye integrator, which is essential for EUV-systems.

The mirrors according to U.S. Pat. No. 4,294,538 are impinged by the rays travelling through the system under an angle of 45°, which is not possible in EUV-systems, since normal incidence mirrors in EUV-systems are comprising more than 40 pairs of alternating layers. A large number of alternating layers leads to phase effects if the mean angle of incidence becomes more than 30° or is lower than 70°. Using an angle of incidence of 45° in an EUV-system as in the state of the art would lead to a total separation of s- and p-polarisation and one of both polarisation is lost completely according to Brewster law. Furthermore such a mirror would function as a polarizing element.

Another disadvantage of the system according to U.S. Pat. No. 4,294,538 are the rays impinging the reticle in the object plane telecentric, which is not possible in EUV-systems using a reflection mask.

Furthermore the system known from U.S. Pat. No. 4,294, 538 is a 1:1 system. This means that the field stop in the object plane of the imaging System has the same size as the field in the image plane. Therefore the field stop has always to be moved with the same velocity as the reticle in the image plane. Furthermore said illumination system should be applicable in high throughput systems working with much higher velocities of reticle and mask than conventional systems e.g. systems known from U.S. Pat. No. 4,294,538.

Object of the invention is to provide an imaging system imaging an object, e.g. a field stop into an image, e.g. a reticle-mask for an illumination system for lithography with wavelengths $\leq 193$ nm. Especially losses should be minimized, while the quality of the image especially regarding edge sharpness in scanning direction should be as high as possible.

Said object of the invention is solved in a first embodiment by a multi-mirror-system comprising an imaging system with at least a first and a second mirror, whereby said first mirror and said second mirror are arranged in the optical path of the imaging system in such a position and having such a shape, that the edge sharpness of the arc-shaped field in the image plane is smaller than 5 mm, preferably 2 mm, most preferably 1 mm in scanning direction. in an advantageous embodiment the edge sharpness of the arc-shaped field in the image plane is smaller than 5 mm, preferably 2 mm, most preferably 1 mm also in the direction perpendicular to the scanning direction.

While the field in the image plane is always arc-shaped, in an first embodiment of the invention the object in the object plane is also an arc-shaped field; which means that the inventive imaging system is not comprising any field forming components.

Advantageously the rays travelling from the object plane to the image plane in the imaging system are impinging the first and the second mirror defining a first and a second used area on the mirrors, whereby the rays are impinging the first and the second mirror in the used area with an incidence angle relative to the surface normal of the mirror $\leq 30°$ or $\geq 60°$ especially $\leq 20°$ or $\geq 70°$, in order to minimize light losses in the system. To move the field stop in the object plane and the reticle in the image plane of the imaging system with different velocities the magnification ratio of the imaging system is unequal to 1.

In a preferred embodiment the inventive imaging system is a non centred system.

Advantageously an aperture stop is located on or close to the plane conjugate to the exit pupil of the imaging system.

Preferably the first and/or the second mirror of the imaging system is an aspheric mirror.

In a preferred embodiment of the invention the first mirror is a concave mirror having a nearly hyperbolic form or a nearly elliptic form and is defining a first axis of rotation.

Furthermore also the second mirror is a concave mirror having a nearly hyperbolic form or a nearly elliptic form and is defining a second axis of rotation.

Preferably the first and the second mirror are comprising a used area in which the rays travelling through the imaging system are impinging the first and the second mirror; the used area is arranged off-axis in respect to the first and second axis of rotation.

In advantageous embodiment the first axis of rotation and the second axis of rotation subtend an angle $\gamma$. Said angle $\gamma$ is calculated from a COMA-correction of the system. The first mirror and the second mirror are defining a first magnification for the chief ray travelling through the centre of the field and the centre of the exit pupil, a second magnification for the upper COMA ray travelling through the centre of the field and the upper edge of the exit pupil and a third magnification for the lower COMA ray travelling through the centre of the field and the lower edge of the exit pupil. If the system is COMA corrected the first, the second and the third magnification are nearly identical. Said condition defines the angle $\gamma$ between the first and the second axis of rotation.

In an second embodiment of the invention a multi-mirror-system for an illumination system with wavelengths $\leq 193$ nm is comprising an imaging system, whereby said imaging system comprises at least a first mirror and a field forming optical component In such an embodiment of the invention the field in the object plane can be of arbitrary shape, e.g. a rectangular field.

In case of a rectangular field the rectangular field is formed into an arc-shaped field in the image plane by the field forming optical component of the imaging system. The advantage of the second embodiment of the invention is the fact, that no extra optical components for forming the field in the light path arranged before the inventive multi-mirror-system are necessary. This reduces the total number of mirrors in the illumination system and therefore the losses within the illumination system.

Preferably the aforementioned field forming component of the second embodiment comprises at least one grazing incidence mirror. Grazing incidence mirrors have the advantage that they must not be coated, whereas normal incidence mirrors in the EUV-range are always multilayer systems with high losses.

In a preferred embodiment the field forming component comprises two mirrors, a first grazing incidence mirror with positive optical power and a second grazing incidence mirror for rotating the field.

Another preferred embodiment employs a single grazing incidence field lens with negative optical power to achieve an arc-shaped field with the desired orientation.

Apart from the imaging system the invention provides an illumination system, especially for lithography with wavelengths $\leq 193$ nm with a light source, a multi-mirror system comprising an imaging system, whereby the imaging system comprises an object plane. The illumination system further comprises an optical component for forming an arc-shaped field in the object plane of the multi-mirror-system, in the light path arranged before the multi-mirror system. The multi-mirror-system is a system according to the invention for imaging the field from the object plane into the image plane of the imaging system.

To enhance the étendue said illumination system could comprise at least one mirror or one lens which is or which are comprising raster elements for forming secondary light sources.

The aforementioned illumination system could be used in an EUV projection exposure unit comprising a mask on a carrier system, said mask being positioned in the image plane of the imaging system, a projection objective with an entrance pupil, said entrance pupil is situated in the same plane as the exit pupil of the illumination system and a light sensitive object on a carrier system.

Preferred embodiments of the invention are described with regard to the following figures.

Figure 1:
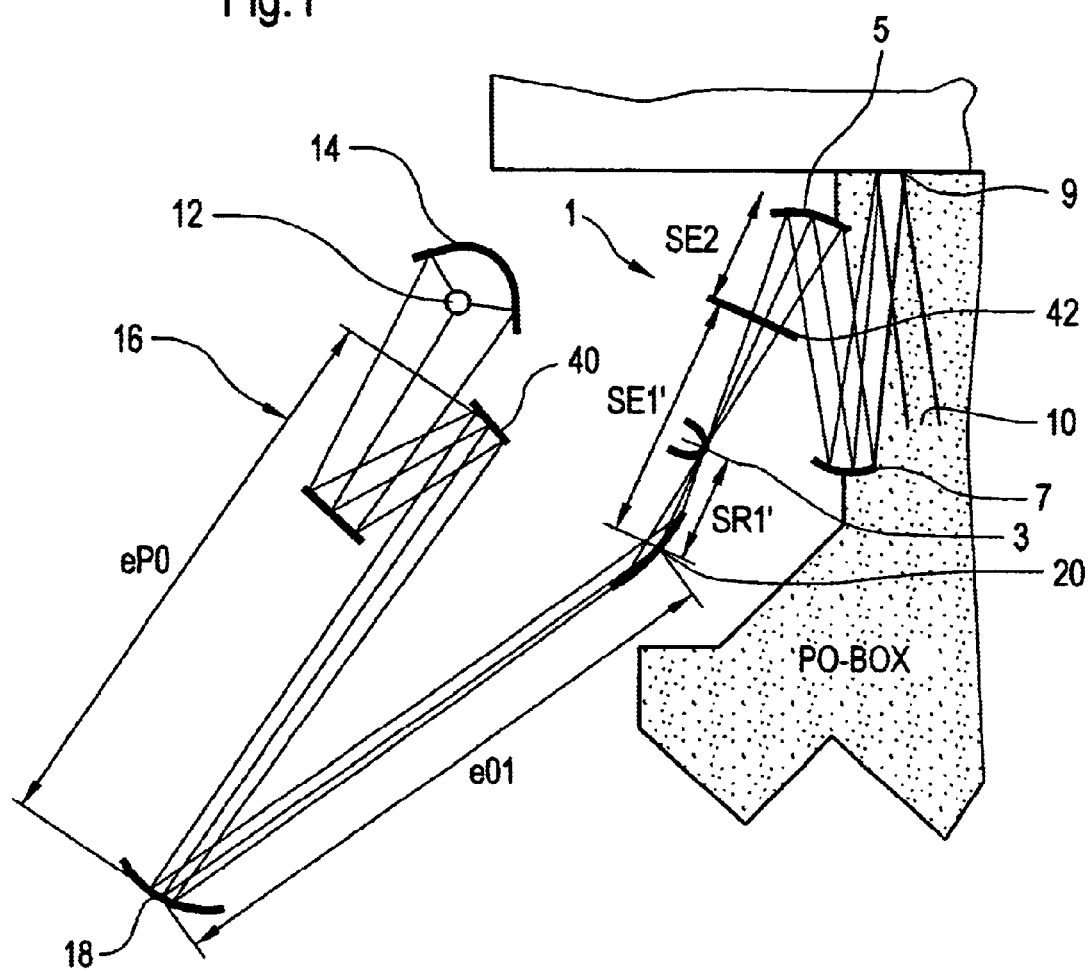
Figure 2:
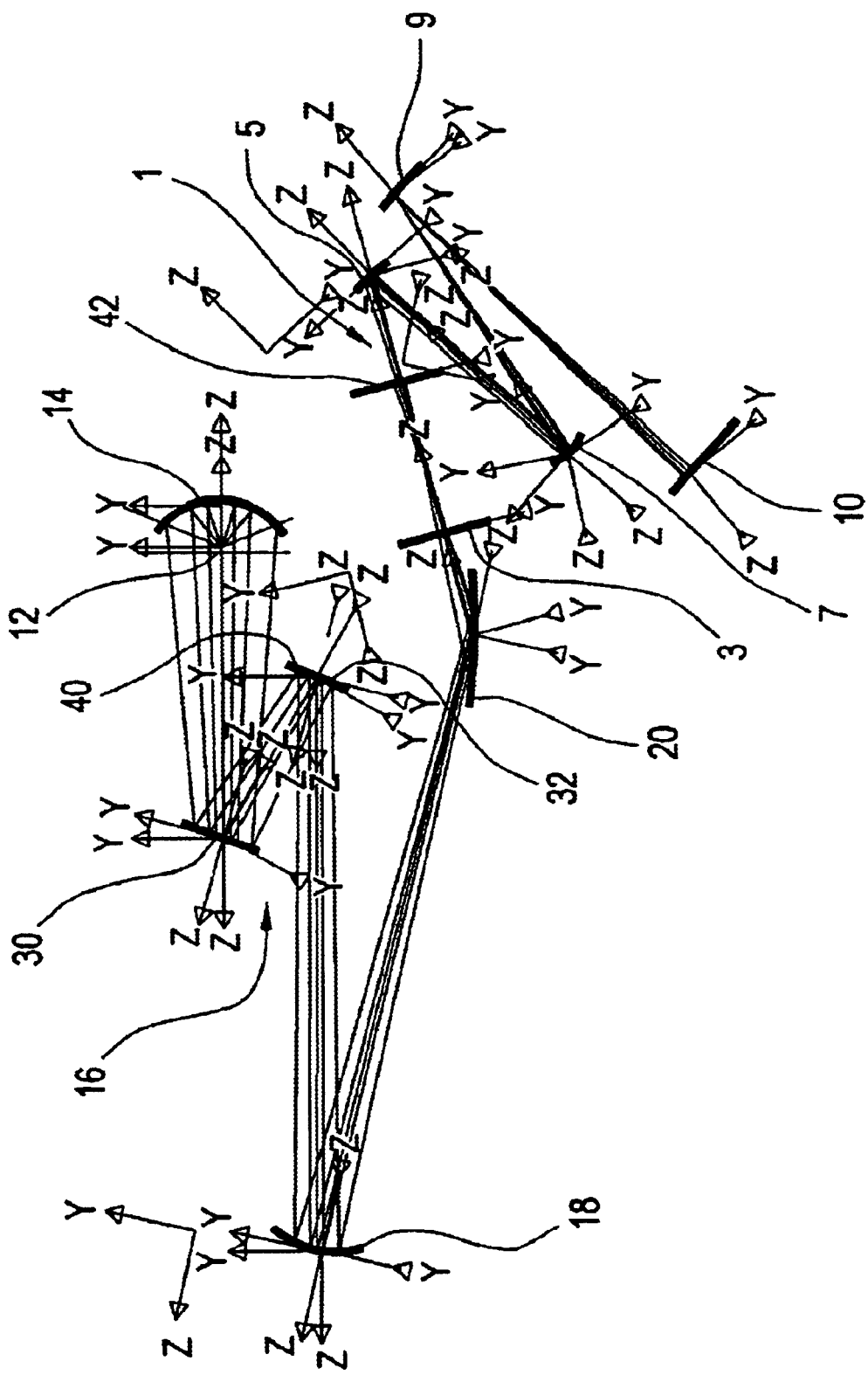
Figure 3:
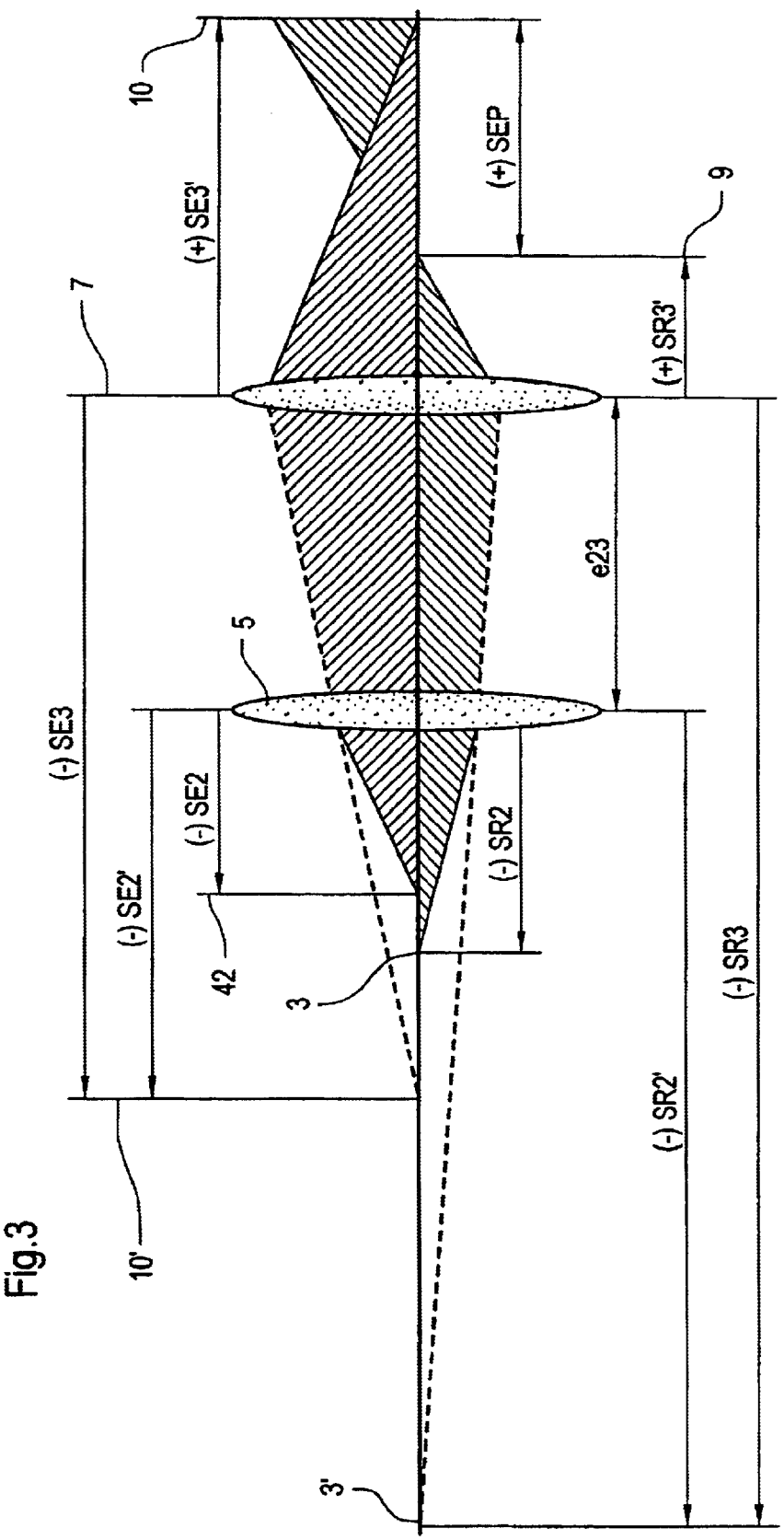
Figure 9:
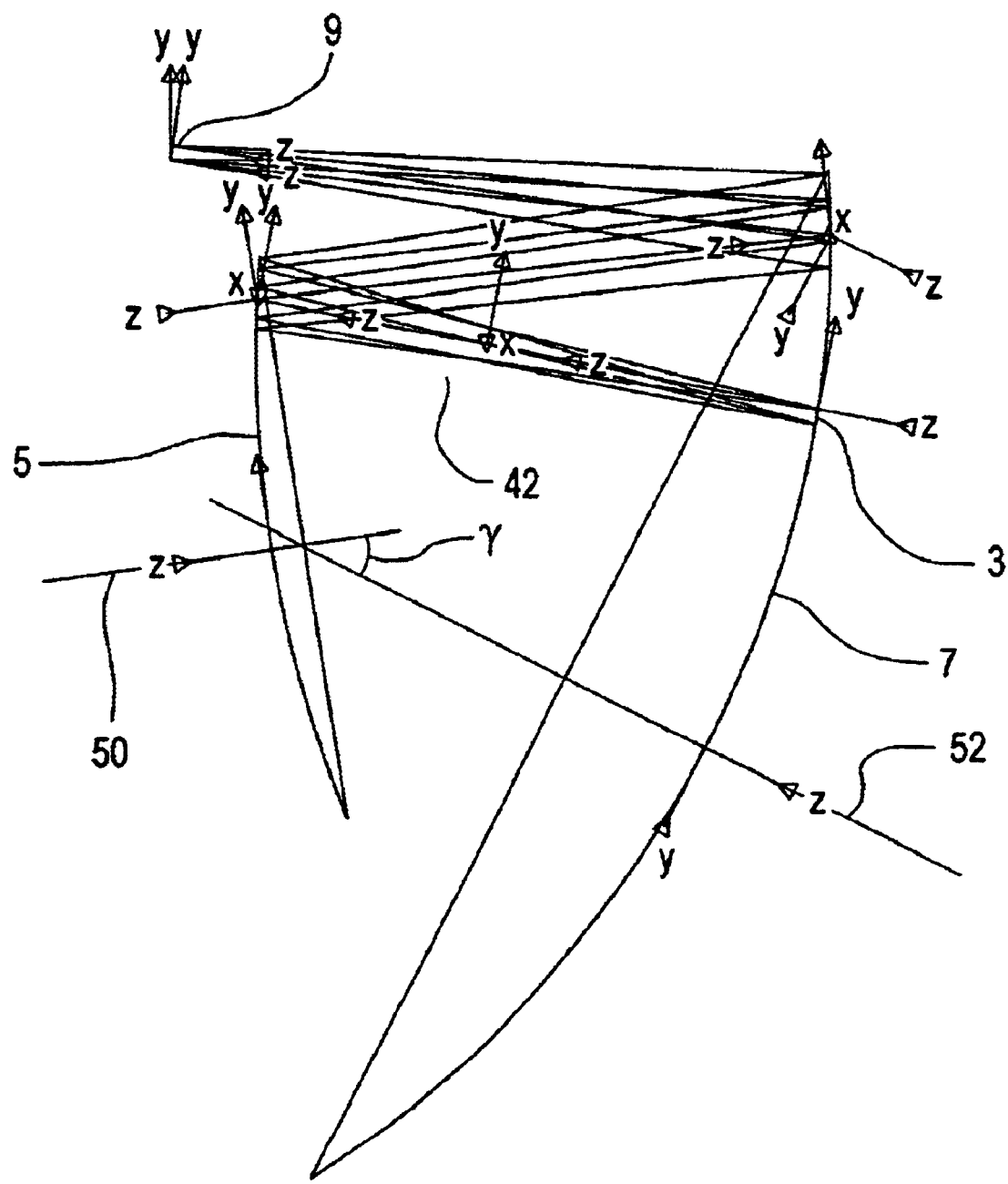
Figure 10:
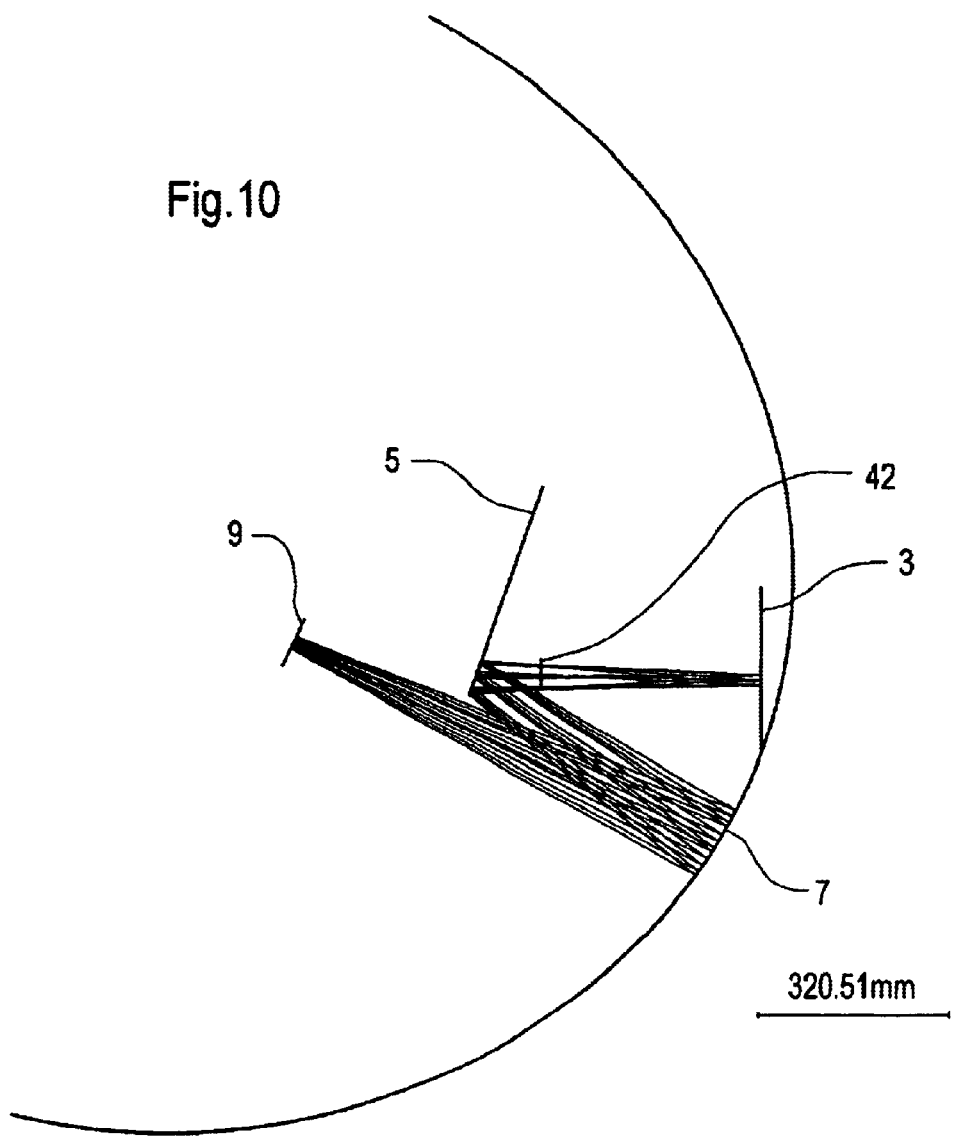
Figure 11:
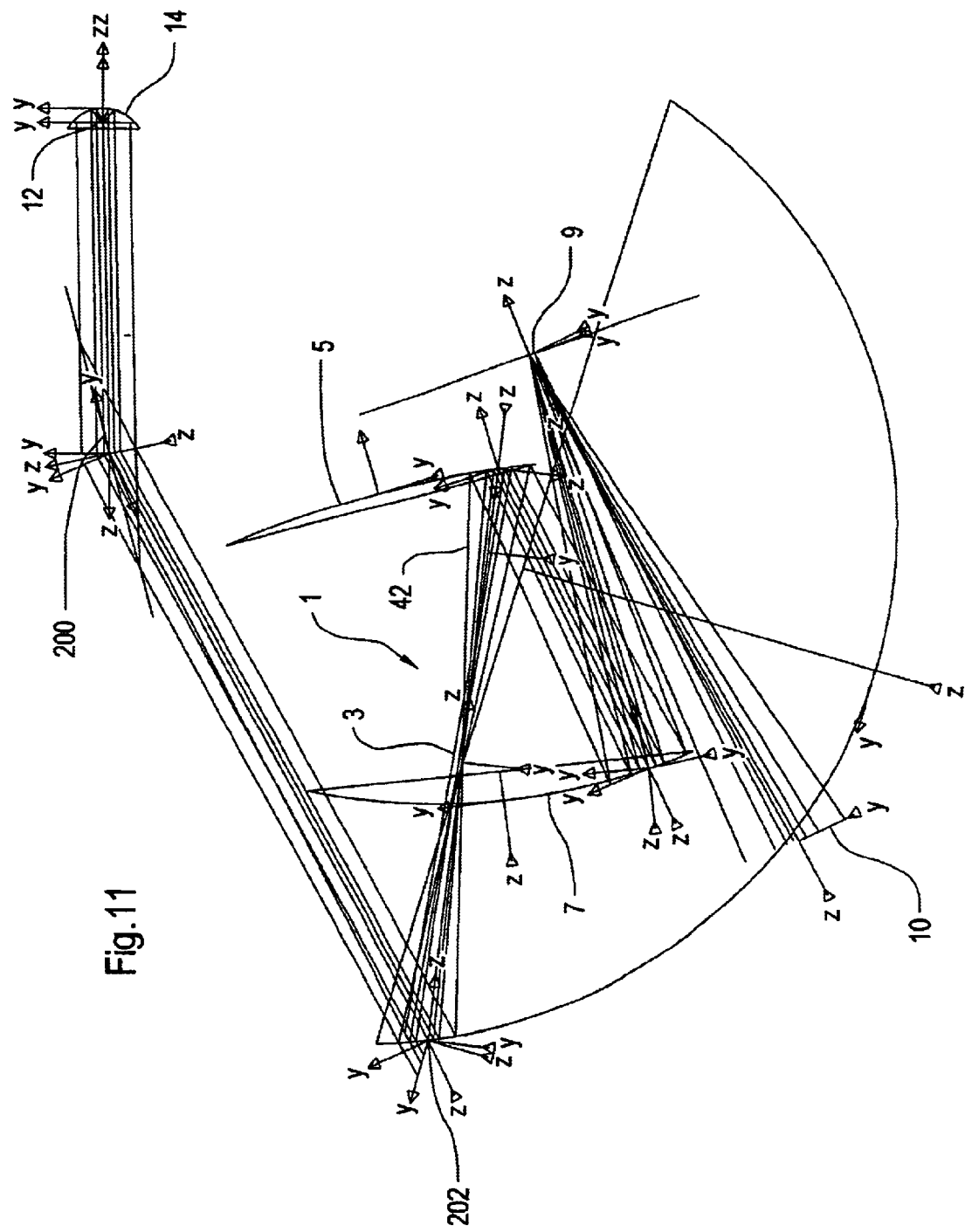
Figure 12:
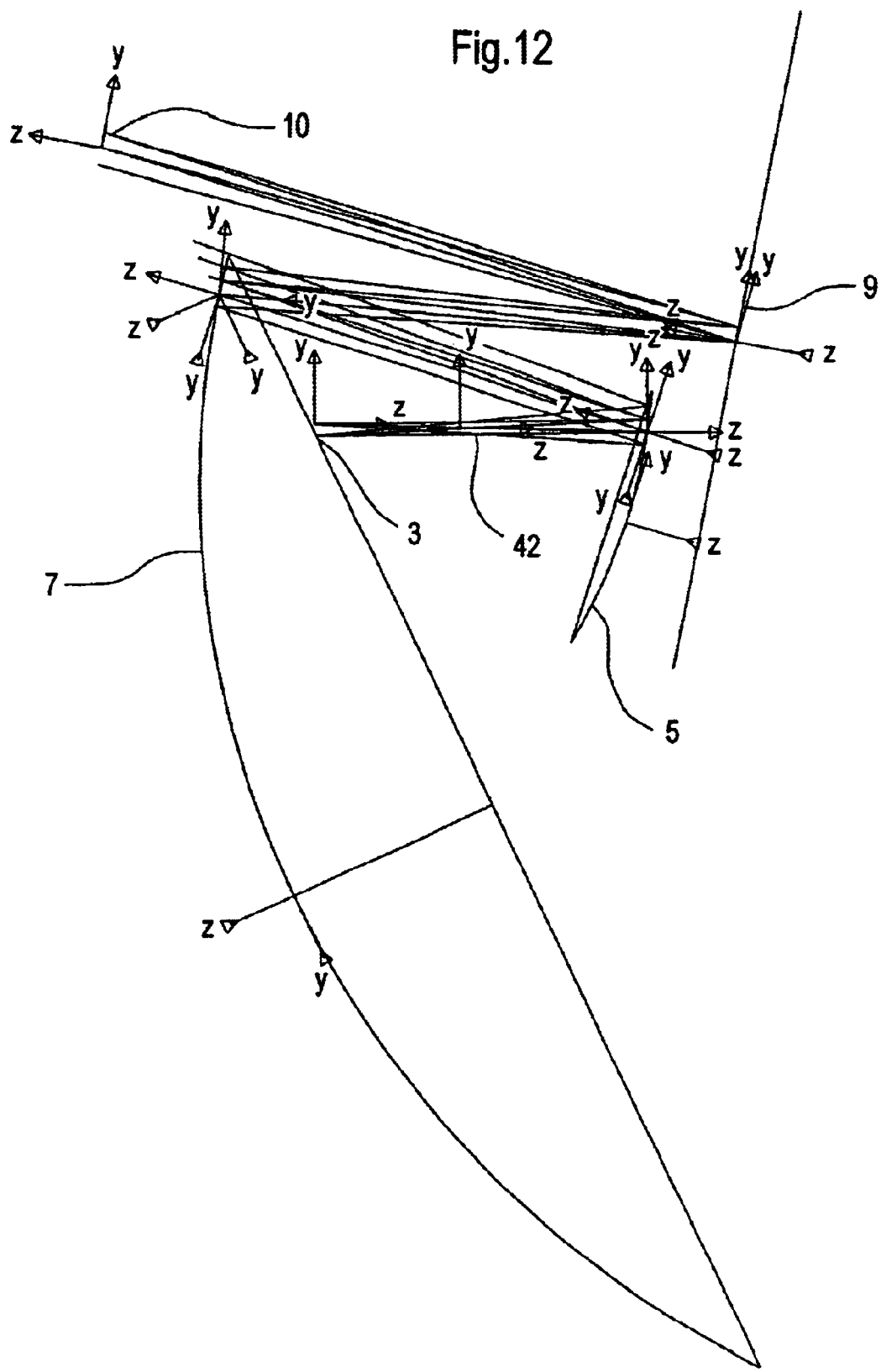
Figure 14:
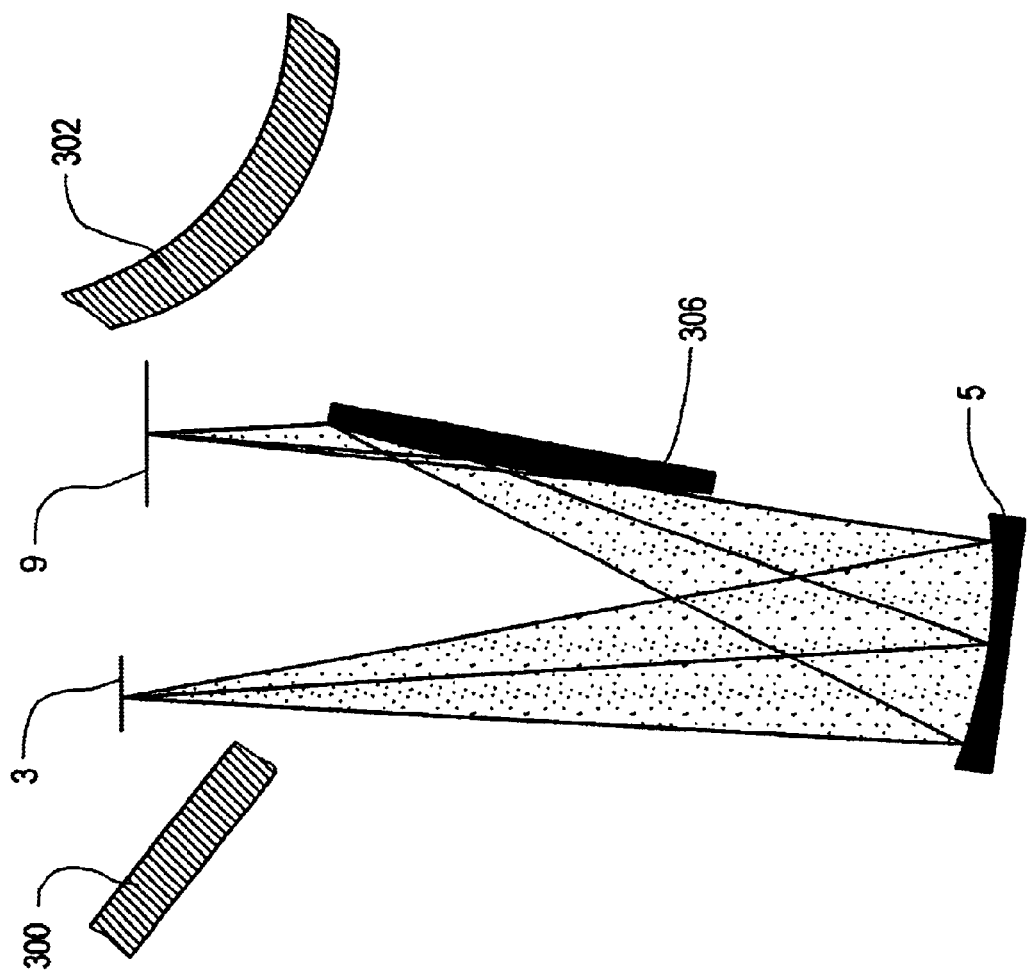
Figure 15:
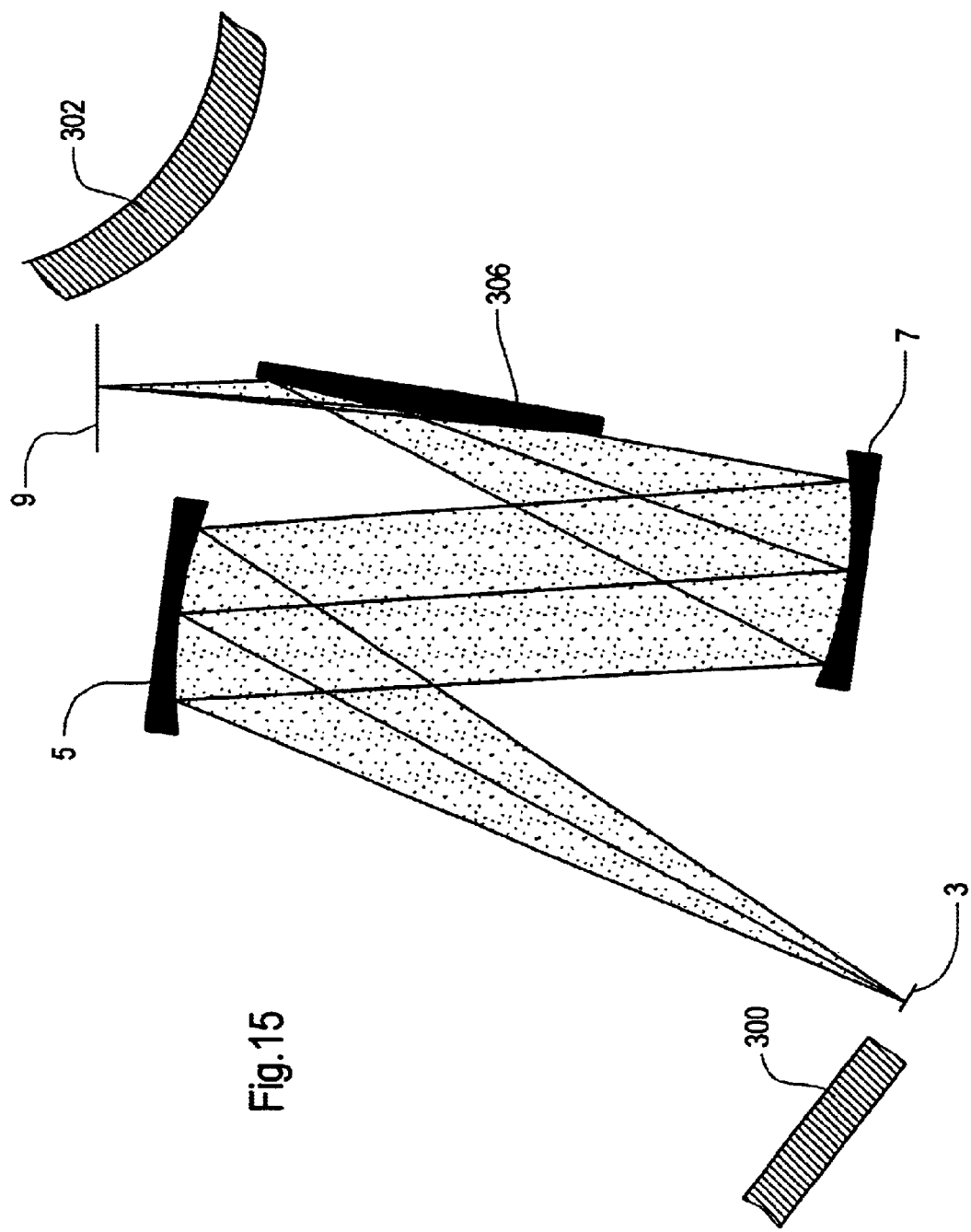
Figure 16:
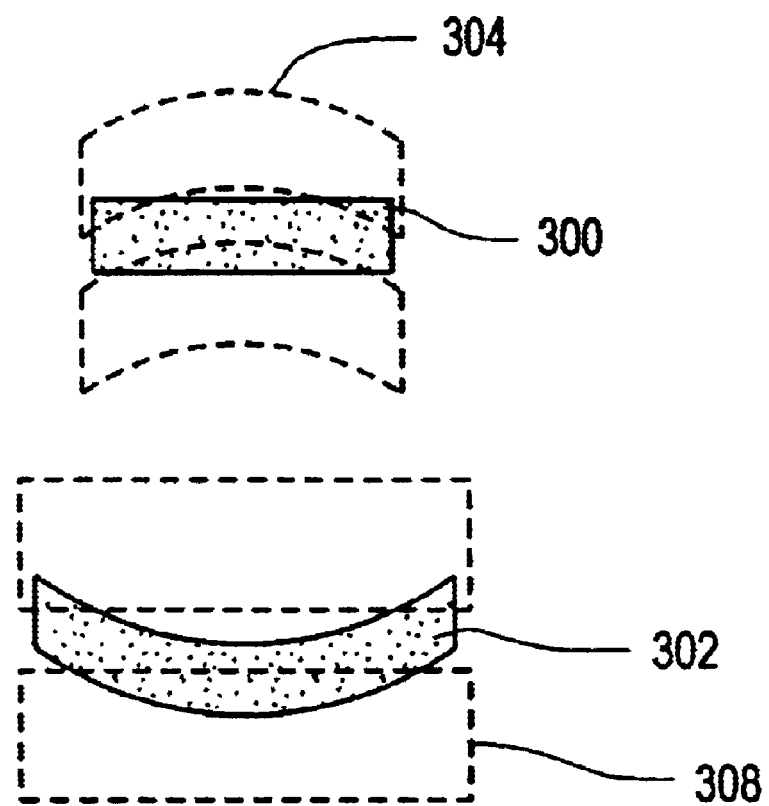

In the figures are shown:

| | |
|---|---|
| FIG. 1 and FIG. 2: | complete illumination system with an imaging system according to the invention and an arc-shaped field in the object plane of the imaging system |
| FIG. 3: | a schematic view of the inventive illumination system |
| FIGS. 4 to 7: | schematic views of the inventive illumination system with abbreviation used for the derivation of the COMA correction of the system |
| FIG. 8: | detailed view of a COMA-corrected system |
| FIG. 8.1: | arc-shaped field in the image plane |
| FIGS. 8.2 and 8.3: | spot diagrams of the system according to FIG. 8 in the image plane |
| FIG. 9: | detailed view of a system with correction of COMA, astigmatism and spherical aberration and a magnification of −1.0 |
| FIGS. 9.1 to 9.2: | spot diagrams of the system according to FIG. 9 in the image plane |
| FIG. 10: | detailed view of a system with correction of COMA, astigmatism and spherical aberration of −0.85 |
| FIGS. 10.1 to 10.2: | spot diagrams of the system according to FIG. 10 in the image plane |
| FIG. 11: | EUV-illumination system with an inventive imaging system and a ripple plate as field forming component |
| FIG. 12: | detailed view of a COMA corrected imaging system with a magnification $\beta = -1.5$ |
| FIGS. 12.1 to 12.2: | spot diagram of a system according to FIG. 12 in the image plane |
| FIG. 13: | detailed view of an imaging system with a magnification $\beta = -1.5$ and correction of COMA, astigmatism and spherical aberration |
| FIGS. 13.1 to 13.2: | spot diagram of a system according to FIG. 13 in the image plane |
| FIG. 14: | schematic view of an imaging system comprising a normal and a grazing incidence mirror as field forming component |
| FIG. 15: | schematic view of an imaging system comprising two normal and a grazing incidence mirror as field forming component |
| FIG. 16: | view of the field in the object- and the image plane with field stop or REMA-blades |
| FIG. 17: | detailed view of a system according to FIG. 15 |
| FIG. 17.1: | spot diagram of a system according to FIG. 17 |
| FIG. 18: | detailed view of a system according to FIG. 16 |
| FIG. 18.1: | spot diagram of a system according to FIG. 18 |

In FIG. 1 an EUV-illumination system comprising an inventive imaging system 1 comprising an object plane 3, a first mirror 5, a second mirror 7 and an image plane 9 is shown. In the object plane 3 the field stop of the system is located. Furthermore the field in the object plane 3 is already arc-shaped. The imaging system 1 images the arc-shaped field from the object plane 3 into the image plane 9. In the image plane 9 the reticle or mask of the EUV-illumination system is located. Also shown is the exit pupil 10 of the imaging system 1, which is identical with the exit pupil of the total EUV-illumination system. The exit pupil 10 falls together with the entrance pupil of the projection optical system. Furthermore the EUV-illumination system shown in FIG. 1 comprises a light source 12, a collector 14, means 16 for enhancing the étendue of the light source 12 and field forming mirrors 18, 20 for forming the arc-shaped field in the object plane 3 of the imaging system 1. Also shown are a first plane 40 conjugate to the exit pupil 10 and a second plane 42 conjugate to the exit pupil 10. Furthermore the distance ePO between first field forming mirror 18 and the first plane 40 conjugated to the exit pupil 10, the distance e01 between the first 18 and the second 20 field forming mirror, the distance SE1' between the second field forming mirror 20 and the second plane 42 conjugate to the exit pupil 10, the distance SR1' between the second field forming mirror 20 and the object plane 3 and the distance SE2 between the second plane 42 conjugate to the exit pupil 10 and the first imaging mirror 5 is depicted.

Throughout the system examples shown hereinafter some parameters remain constant The design principles as shown below however, can also be applied to other sets of parameters.

In all embodiments shown in this application the incidence angle at the image plane 9 of the imaging system is 60 and the numerical aperture at the image plane 9 is NA=0.05. It corresponds for example to a NA=0.0625 of the projection lens and a σ=0.8. The projection lens arranged in the light path after the EUV-illumination system has typically a 4×-magnification and thus NA=0.25 at the light sensitive object e.g. the wafer of the EUV-projection exposure unit.

FIG. 2 shows the EUV-illumination system depicted schematic in FIG. 1 in greater detail. Same components as in FIG. 1 are designated with the same reference numbers.

The system according to FIG. 2 comprises a light source 12 and a collector-mirror 14. Regarding the possible EUV-light sources reference is made to DE 199 038 07 A1 and WO 99/57732, the content of said documents is incorporated herein by reference. The collector mirror 14 of the system according to FIG. 2 is of elliptical shape. The means 16 for enhancing the étendue comprises two mirrors with raster elements 30, 32 so called fly-eyes integrators. The first mirror with raster elements 30 comprises an array of 4×64 field facets; each field facet being of plane or elliptical, toroidal or spherical shape (R≈−850 mm). The second mirror with raster elements 32 comprises an array of 16×16 pupil facets or a spherical or hexagonal grid with pupil facets, each pupil facet being of hyperbolic, toroidal or spherical shape (R≈−960 mm). The second mirror 32 is located in a plane conjugate to the exit pupil 10 of the illumination system.

An illumination system with a first and a second mirror comprising raster elements as described before is known from DE 199 038 07 A1 and WO 99/57732; the content of said applications is incorporated herein by reference.

For forming the arc shaped field in the object plane of the imaging system comprises two field forming mirrors 18, 20. The second field forming mirror 20 is a grazing incidence mirror.

In principle one mirror, here the mirror 20, would be sufficient for field forming. But mirror 18 is required to control the length of the system and the size of the pupil facets. In order to achieve a large field radius of ≈100 mm mirror 20 must have low optical power.

The size of the field and the pupil facets are related to the étendue of the system. The product of the size of the field facets and the size of the pupil plane is determined by the étendue. The pupil plane is a first plane 40 conjugate to the exit pupil 10 of the illumination system. In said plane the to second mirror with raster elements 32 is located. Due to the aforementioned relation restrictions to the size of the field facets and the pupil facets are given. If the magnification for the pupil facets is very large, i.e. the pupil facet is very small, field facets become very large. To avoid large magnification of the imaging of the pupil facets into a second plane 42 conjugate to the exit pupil 10 of the system either the distance between mirror 20 and the second mirror with raster elements 32 increases or an additional mirror 18 has to be introduced. The first field forming mirror 18 has almost all power of the imaging system consisting of a first field forming mirror 18 and a second mirror 20 for imaging the pupil facets of the second field forming mirror with raster elements 32 into the second plane 42 conjugate to the exit pupil 10 of the system.

The data for the first field mirror 18 and the second field mirror 20 are given in table 1:

TABLE 1

Data for the first and the second field mirror

|  | first field mirror 18 | second field mirror 20 |
| --- | --- | --- |
| shape | hyperbola | ellipsoid |
| f | ≈1616 mm | ≈605 mm |
| incidence angle versus surface normal | 7° | 75° (grazing incidence) |
| conic section layout | for pupil imaging | for pupil imaging |
| $\beta_{pupil\ imaging}$ | 7.46429 | −0.05386 |

The magnification between the first plane 40 conjugate to the exit pupil 10 and the second plane 42 conjugate to exit pupil 10 is $\beta_{40 \to 42} \approx -0.4$. The field radius of the arc-shaped field in the object plane 3 is controlled by the second field mirror 20.

If the magnification $\beta_{image} = -1$ of the imaging system and $R_{Field} = 100$ mm the field radius to be formed by the second field forming mirror 20 is $R_{Obj} = -100$ mm. There are three means to control the radius $R_{Obj}$. The optical power, see table 1, f≈605 mm, the chief ray distance between the second field forming mirror 20 and the object plane 3:

SR1'≈250 mm and the grazing incidence angle.

With the further values for the system layout ePO=1400 mm e01=1550 mm

SE1'≈637 mm

SE2≈−262.965 mm the system can be derived with first order optical formulas.

In the second plane 42 conjugate to the exit pupil 10 an accessible aperture stop for the illumination system could be located.

Also shown in FIG. 2 is the inventive multi-mirror-system comprising an imaging system 1 with a first 5 and a second 7 imaging mirror for imaging the arc-shaped field from the object plane 3, which is conjugate to the field plane, into the image plane 9, which corresponds to the field plane of the illumination system and in which the reticle or mask of the illumination system is located.

The conjugate field plane 3 could be used as a plane for reticle masking. Said plane is located near to the second field forming mirror 20 at the limit for construction, e.g. SR'≈250 mm chief ray distance for ≈15° grazing ret incidence reflection on the mirror. The field in the conjugate field plane which is the object plane 3 is arc-shaped by field forming mirror 20, thus rema blades need to be almost rectangular. Small distortions of a following rema system can be compensated for.

Since all mirrors of the illumination system have positive optical power, the field orientation in the conjugate field plane 3 after positive mirror 20 is mirrored by negative magnification of the inventive imaging system 1. The field orientation in the field plane 9 is then correct.

Since the second field forming mirror 20 is off-axis in order to compensate the distortion due to this off-axis arrangement, the pupil facets have to be arranged on the second mirror with raster elements 32 on a distorted grid.

With pupil facets arranged on a pre-distorted grid optimized pupils with respect to telecentricity and ellipticity can be achieved.

The derivation of a multi-mirror-system comprising an imaging system for imaging a REMA-blade situated in the object-plane or REMA-plane 3 of the inventive multi-mirror-system into the image plane or field plane 9, wherein the reticle is situated will be described in detail hereinbelow.

FIG. 3 shows in a schematic refractive view the elements of the inventive imaging system and abbreviations used in table 1. Furthermore components with reference numbers used in FIG. 1 and 2 are designated with the same reference numbers. Furthermore in FIG. 3 is shown the virtual image 3' of the field plane and the virtual image 10' of the exit pupil.

The imaging system according to FIG. 3 and table 2 is a hyperbolic-ellipsoid combination as a first order starting system. The data of the first order system are given in table 2.

TABLE 2

First order system layout

| first imaging mirror 5 | Hyperboloid field imaging | second imaging mirror 7 | Ellipsoid pupil imaging |
|---|---|---|---|
| f | e 23<br>768.1818<br>Pupil imaging | 650.0<br>f | 650.0 |
| SE2 | −262.9651 | SE3 | −1049.8383 |
| SE2' | −399.8383 | SE3' | 1706.6772 |
| β2 | 1.5205<br>Field imaging | β3 | −1.6257 |
| SR2 | −650.0 | SR3 | −4875.0 |
| SR2' | −4225.0 | SR3' | 750.0 |
| β2 | 6.5 | β3 | −0.15385 |

For the results of table 2, well-known first-order lens-formulas where used, e.g.

$\beta = S'/S$ $S_{i+1} = S_i - e_{i,i+1}$ $f = 1/(1/S' - 1/S)$ ("lens-maker"-equation) (4)

where S and S' stands for SE and SE' or SR and SR', respectively.

In the next step designing an imaging system according to the inventior; the first order system shown in table 2 is optimized and COMA corrected.

Figure 4:
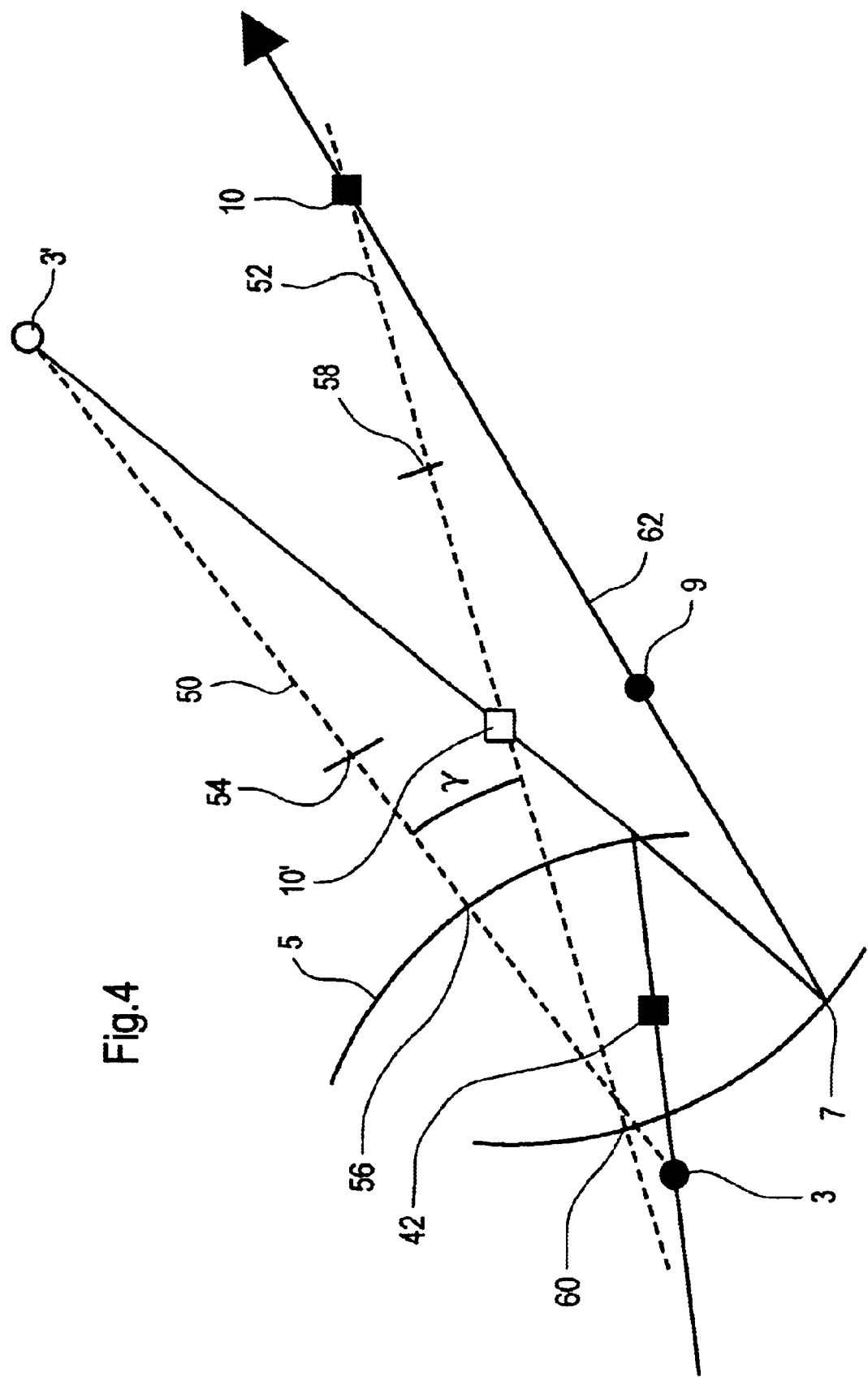
Figure 5:
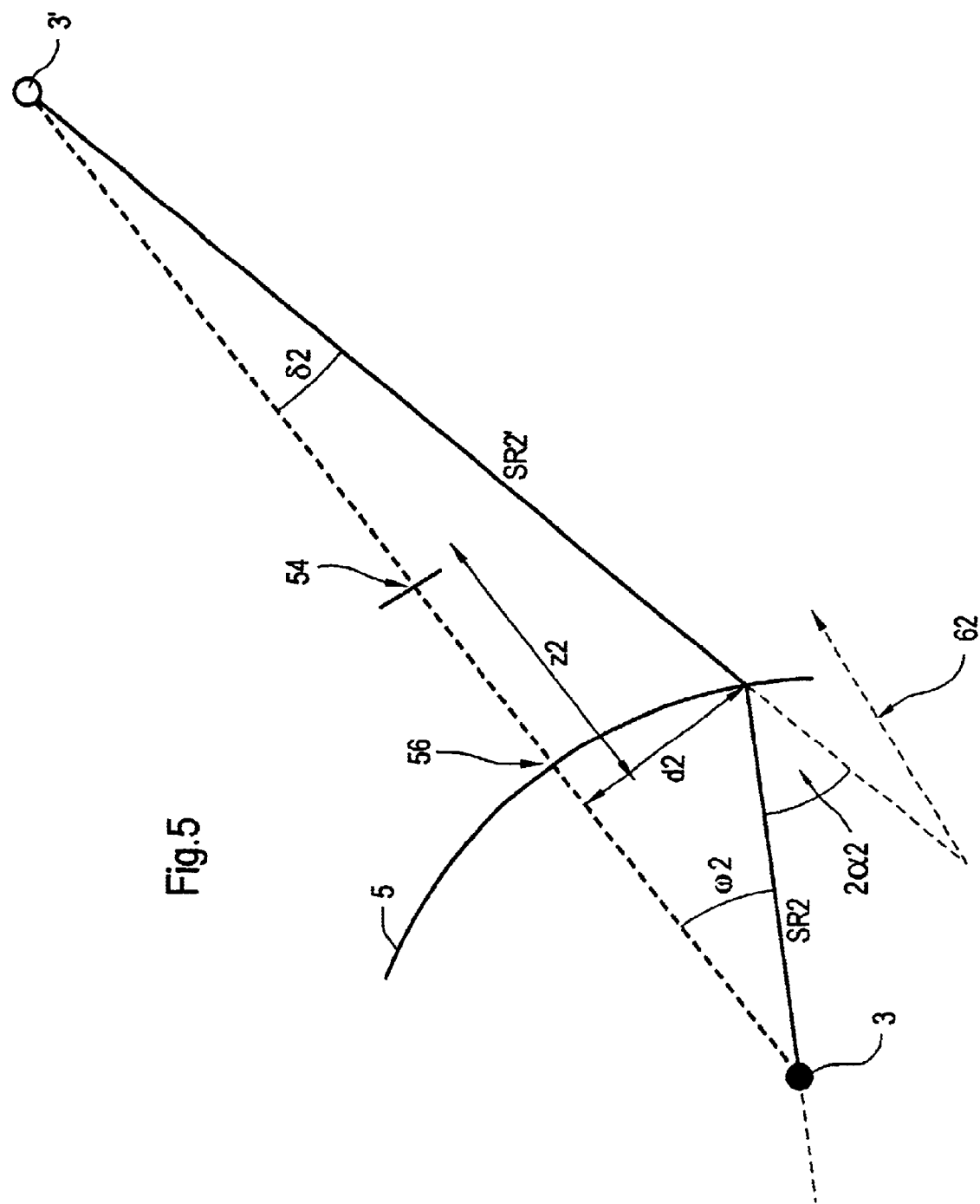

The first mirror 5 of the imaging system is a hyperbolic mirror, optimized for field imaging, which means imaging of the field in the REMA plane 3 into the field plane 9. The second mirror 7 of the imaging systems is an elliptical mirror optimized for pupil imaging, which means imaging of the second plane 42 conjugate to the exit pupil into the exit pupil 10. The overall system comprising the first 5 and the second 7 imaging mirror with abbreviations used in table 3 for the COMA corrected system is shown in FIGS. 3 to 5. Identical components as in FIG. 1, FIG. 2 and FIG. 3 are designated with the same reference numbers.

Apart from the elements already shown in FIGS. 1 and 2 in FIG. 3; FIG. 4 shows:

the axis of rotation 50 of the first imaging mirror 5
the axis of rotation 52 of the second imaging mirror 7
the centre 54 of the first imaging mirror
the vertex of the first imaging mirror 56
the virtual image 3' of the field plane 3
the centre 58 of the second imaging mirror
the vertex of the second imaging mirror 60
the virtual image 10' of the exit pupil 10 of the illumination system
the chief ray 62

As is apparent from FIG. 4 the axis 50 of the hyperbolic mirror 5 and the axis of the elliptic mirror 7 subtend an angle γ.

Figure 6:
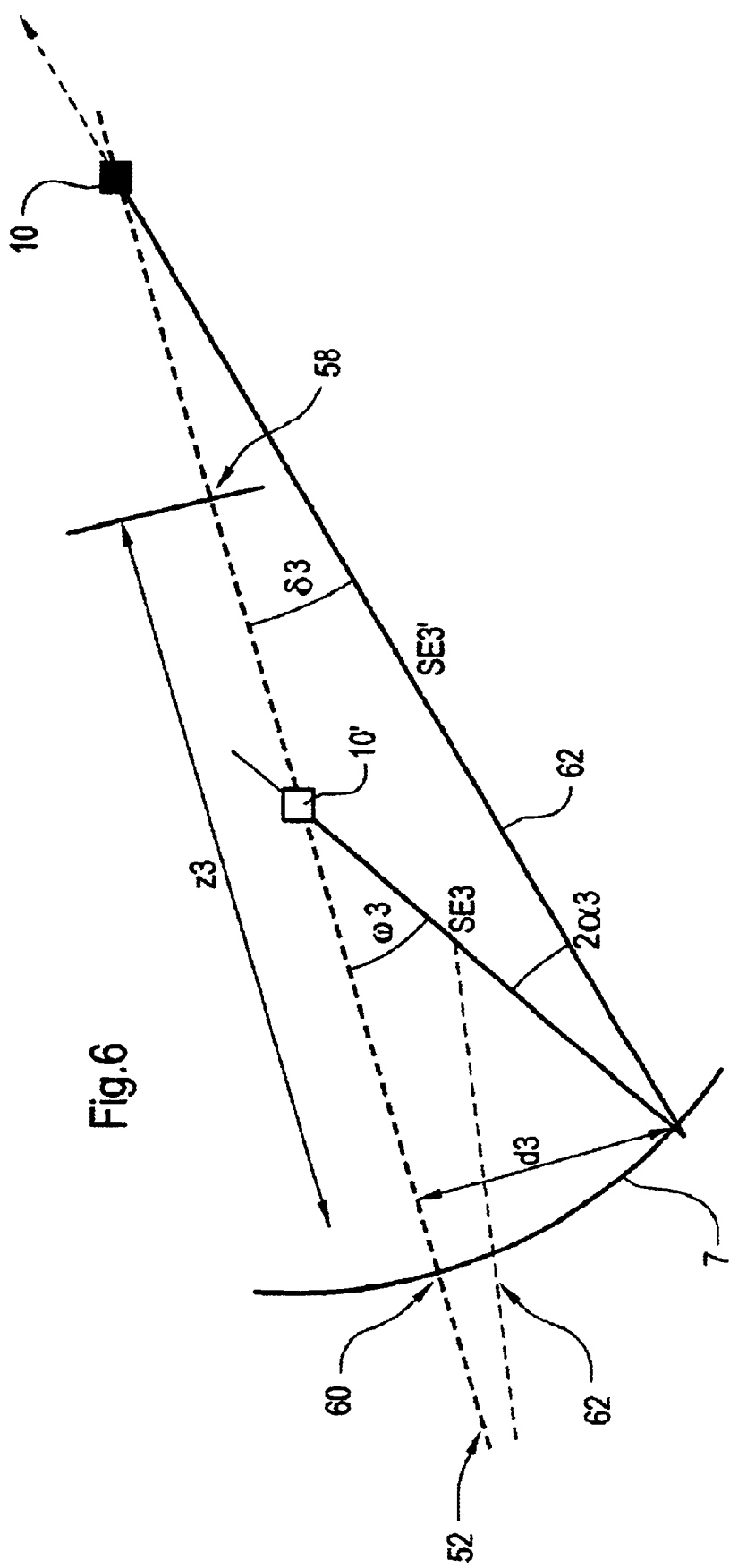

FIG. 5 shows in detail the first imaging mirror 5, which is in this embodiment a hyperboloid, of the inventive imaging system according to FIG. 4 and FIG. 6 the second imaging mirror 7 of the imaging system according to FIG. 4, which in this embodiment is a ellipse. The same elements as in FIG. 4 are designated in FIG. 5 and FIG. 6 with the same reference numbers.

In FIG. 5 depicting the first hyperbolic mirror 5 the abbreviation used for the following equations calculating the parameters of the hyperbola are known:

With positive angles $\omega_2$ and $\delta_2$ follows $$d_2 = -SR2 \cdot \sin(\omega_2) = -SR2' \cdot \sin(\delta_2) \quad (5)$$

$$\omega_2 = 2\alpha_2 - \delta_2 \quad (6)$$

$$\Rightarrow \beta_{field} = \frac{SR2}{SR2'} = \frac{\sin(2\alpha_2 - \delta_2)}{\sin(\delta_2)} = \frac{\sin(2\alpha_2)}{\tan(\delta_2)} - \cos(2\alpha_2) \quad (7)$$

$$\Rightarrow \delta_2 = \arctan\left(\frac{\sin(2\alpha_2)}{\beta_{field} + \cos(2\alpha_2)}\right) \quad (8)$$

Then the angle between incident chief ray and hyperbola axis is:

$\omega_2 = 2\alpha_2 - \delta_2$

Hyperbola equation:

$$\frac{z^2}{a^2} - \frac{d^2}{b^2} = 1; a = \sqrt{e^2 - b^2} \quad (9)$$

insertion and solution for $b^2$ gives:

$$b^4 + (z^2 + d^2 - e^2)b^2 - d^2 e^2 = 0 \quad (10)$$

$$\Rightarrow b^2 = \frac{-(z^2 + d^2 - e^2) + \sqrt{(z^2 + d^2 - e^2)^2 - 4d^2 e^2}}{2} \quad (11)$$

with equation (5) and $$z_2 = e + SR2 \cdot \cos(\omega_2) \quad (12a)$$

$$e = \frac{(-SR2 \cdot \cos(\omega_2) - SR2' \cdot \cos(\delta_2))}{2} \quad (12b)$$

the parameters defining the hyperbola can be calculated.

In FIG. 6 depicting the second elliptic mirror 7 the abbreviations used for the following equations calculating the parameters of the ellipse are shown:

With positive angles $\omega_3$ and $\delta_3$ follows $$d_3 = -SE3 \cdot \sin(\omega_3) = +SE3' \cdot \sin(\delta_3) \quad (13)$$

$$\omega_3 = 2\alpha_3 + \delta_3 \quad (14)$$

$$\Rightarrow -\beta_{pupil} = \frac{SE3'}{-SE3} = \frac{\sin(2\alpha_3 + \delta_3)}{\sin(\delta_3)} = \frac{\sin(2\alpha_3)}{\tan(\delta_3)} + \cos(2\alpha_3) \quad (15)$$

$$\Rightarrow \delta_3 = \arctan\left(\frac{-\sin(2\alpha_3)}{\beta_{field} + \cos(2\alpha_3)}\right) \quad (16)$$

The angle between incident chief ray and the hyperbola axis is defined by equation (14).

Ellipsoid equation:

$$\frac{z^2}{a^2} + \frac{d^2}{b^2} = 1; a = \sqrt{e^2 + b^2} \quad (17)$$

insertion and solution for $b^2$ gives:

$$b^4 + (e^2 - z^2 - d^2)b^2 - d^2 e^2 = 0 \quad (18)$$

-continued $$\Rightarrow b^2 = \frac{-(e^2 - z^2 - d^2) + \sqrt{(e^2 - z^2 - d^2)^2 - 4d^2 e^2}}{2} \quad (19)$$

with equation (13) and $$z_3 = e - SE2 \cdot \cos(\omega_3) \quad (20a)$$

$$e = \frac{(SE3 \cdot \cos(\omega_3) + SE3' \cdot \cos(\delta_3))}{2} \quad (20b)$$

the parameters defining the ellipsoid can be calculated.

Furthermore for ellipse and hyperbola following equations are well known:

$$p = \frac{b^2}{a} \quad \text{curvature at node } R = -p \quad (21)$$

$$\varepsilon = \frac{e}{a} \quad \text{eccentricity} \quad (22)$$

$$K = -\varepsilon^2 \quad \text{conic constant} \quad (23)$$

By COMA-correcting the first order system according to table 2 with an analytical calculation angle γ is determined. The COMA-correction uses for calculating γ the magnification of the imaging for the chief ray 62 and the coma-rays not shown in FIG. 4–6. The differences in magnifications can be reduced by minimization of the angle of incidence $\alpha_3$ (7°) and corresponding selection of $\alpha_2$. In this example the equations are minimized by the gradient method, which means choose a start system e.g. according to table 2, calculate the magnifications, change the angle $\alpha_2$ and calculate a new magnifications. From the difference in magnifications the next $\alpha_2$ can be calculated. Repeat this algorithm until difference in magnification for the chief ray and the upper and lower COMA-ray is less than e.g. 0,5%.

Figure 7:
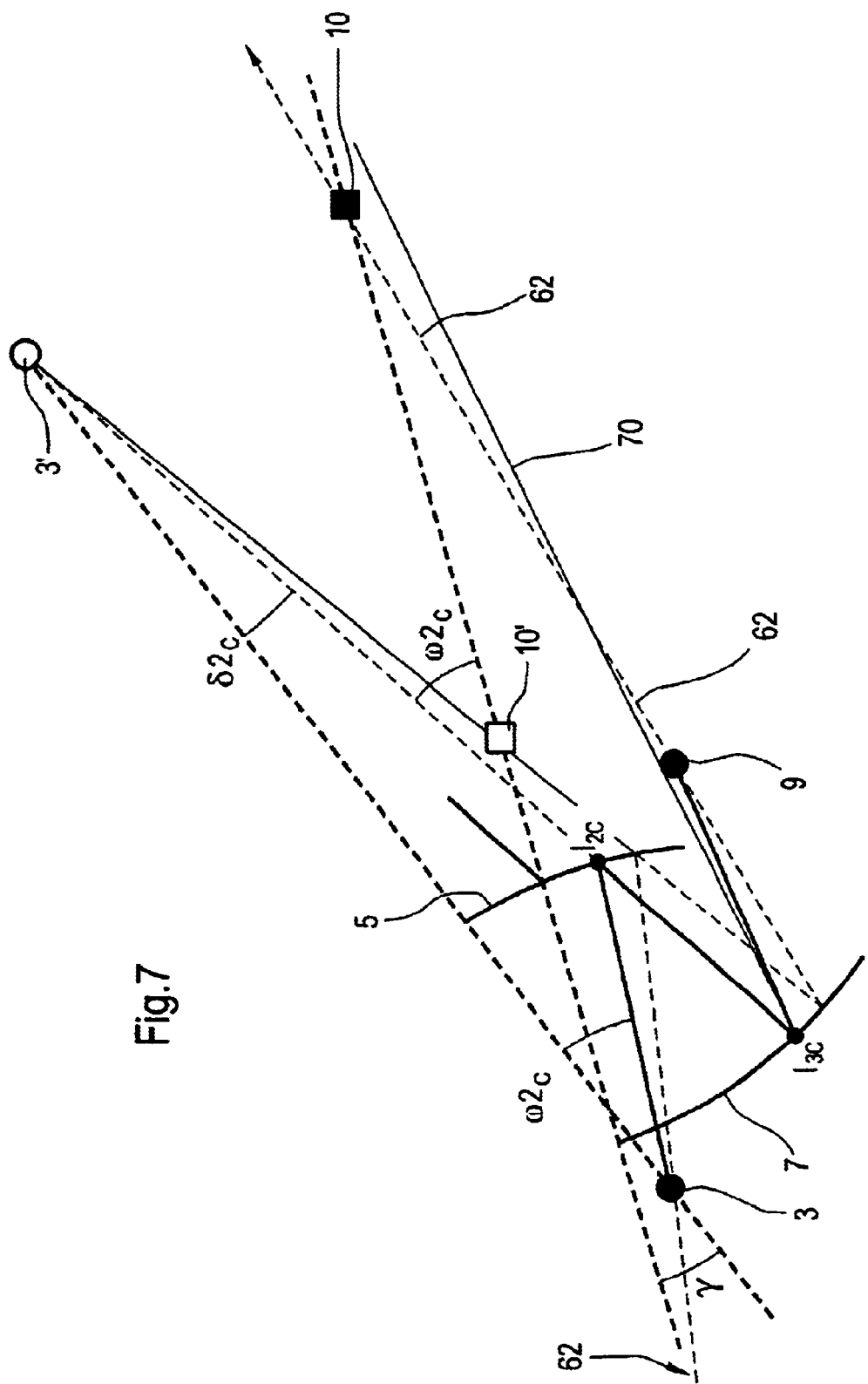

The COMA-correction will be described hereinbelow in detail with reference to FIG. 7. Identical elements as in FIG. 1 to 6 are designated with the same reference numbers. Furthermore in FIG. 7 is shown the lower COMA ray 70.

The calculation of the magnifications along the chief ray 62 is clear from the first order derivation.

The calculation for the COMA or rim rays is shown with regard to the lower COMA ray 70.

The COMA rays 70 for the imaging 3→3' at the hyperbola is straight forward. The COMA or rim rays in the object plane 3 can be defined by the angles between rays and hyperbola axis:

$$S_c = \overline{RI_{2c}} = \frac{p}{1 + \varepsilon \cos(\omega_{2c})} \quad (25)$$

$$S'_c = \overline{I_{2c}R'} = S_c + 2a \quad (26)$$

with $\omega_2$ as shown in FIG. 5.

The distances between the image points 3 and 3' and the intersection point $I_{2c}$ of the mirror with the COMA or rim rays are given by hyperbola formulas in polar co-ordinates:

$$\omega_{2c} = \omega_2 \mp \arcsin(|NA_{reticle} \cdot \beta_{rema,field}|) \quad (24)$$

α, ε, p: hyperbola parameters

To calculate the lengths at the ellipse is more complicated, because the COMA or rim rays will not intersect in the plane 9 any more. However the magnification can be calculated approximately after calculating the intersection point $I_{3c}$. With $$\omega_{3c} = \delta_{2c} \pm \gamma \quad (27)$$

for given γ, $\omega_{3c}$ and thus the intersection point $I_{3c}$ can be calculated. With $$L_c = \overline{R'I_{3c}} \quad (28)$$

$$L'_c = \overline{I_{3c}R''} \quad (29)$$

the magnification of the rema-imaging system for the rim or COMA rays follows $$\beta_{c\pm} = \frac{L'_c}{L_c} \cdot \frac{S'_c}{S_c} \quad (30)$$

As shown in FIG. 7 this derivation is not exact, because the rim rays will not intersect in the image plane 9 exactly. However, magnification can be calculated with reasonable accuracy, sufficient for a minimisation of the COMA error.

An optimisation with the gradient method described before leads to the solution given in table 3.

TABLE 3

COMA corrected system starting from the system according to table 1.
Design parameters (abbreviation see FIGS. 4 to 6)

| first imaging mirror 5 | | second imaging mirror 7 | |
| --- | --- | --- | --- |
| α2 | 16.328° | α3 | 7.0° |
| δ₂ | 4.2034 | δ₃ | 20.26125 |
| ω2 | 28.4526 | ω₃ | 34.26125 |
| d₂ = YDE | 309.6806 | d₃ = YDE | 591.0246 |
| z₂ | 1821.0739 | z₃ | 1234.3716 |
| a | 1787.5 | a | 1378.2578 |
| b | 1590.3439 | b | 1328.5797 |
| e | 2392.5614 | e | 366.7021 |
| R | −1414.9336 | R | −1280.6922 |
| eps = e/a | 1.3385 | eps = e/a | 0.2661 |
| K = −eps^2 | −1.7916 | K = −eps^2 | −0.0708 |
| ZDE = z₂ − a | 33.5616 | ZDE = a − z₃ | 143.8861 |

YDE and ZDE are the y- and z-components of the decenter vector of the nearest vertex point of the conic section.

For a COMA-corrected system according to table 3 the magnification difference due to COMA is approx. 0.1% and is identical for the upper and the lower COMA-ray. The data for the magnification β of the inventive two mirror imaging system for the chief ray, the upper and lower COMA-ray after COMA correction is shown in table 4.

TABLE 4

Magnification β for chief ray, upper and lower COMA-ray
Coma-correction of Field imaging

| | Upper COMA-ray | Chief ray | Lower COMA-ray |
| --- | --- | --- | --- |
| Magnification | 1.0012 | 1.0000 | 1.0012 |

In FIG. 8 the COMA-corrected imaging system is shown. Identical elements as in FIGS. 1 to 7 are designated with the same reference numbers.

In FIG. 8.1 the arc-shaped field in the field or reticle plane with carthesian coordinates x and y is shown. Reference number 100 designates a field point in the centre of the arc-shaped field and 102, a field point at the edge of the arc-shaped field. The y-axis denotes the scanning direction and the x-axis the direction perpendicular to the scanning direction.

In FIG. 8.2 the spot diagram for a field point 100 and in FIG. 8.3 the spot diagram for a field point 102 of a COMA-corrected multi-mirror-system according to FIGS. 4 to 8 is depicted. The spot diagram is the diagram resulting from a multiplicity of rays travelling through the system with the aperture $NA_{object}$ and impinging the field or reticle plane in a predetermined field point, e.g. the centre of the field 100. The aperture is $NA_{object}$=0.05 in the system described in FIGS. 4 to 8.

As is apparent from the spot-diagrams 8.2 and 8.3 the edge sharpness EDS in scanning direction, corresponding to the y-axis of the arc shaped field, in COMA corrected system is smaller than 2 mm.

The edge sharpness EDS of a system in scanning direction is defined as the difference of the points with the greatest value and the smallest value in y-direction for an edge field point, e.g. edge field point 102 as shown in FIG. 8.3.

For further optimizing the inventive imaging system astigmatism and spherical aberration has to be considered. Nevertheless a balanced system can be found with only hyperbolic and elliptical mirrors. FIG. 9 and table 5 shows a system which is corrected for spot aberrations <1 mm in scanning direction. Because the rema blades are essentially required to avoid the overscan in scanning direction, it is sufficient to achieve the required performance in scanning direction; here in y-direction.

In FIG. 9 the same elements as in FIGS. 1 to 8 are designated with the same reference numbers. In FIGS. 9.1 and 9.2 the spot-diagrams for a point in the centre of the field 100 and for an edge point 102 is depicted.

The optical data of the system according to FIG. 9 are shown in table 5.

The embodiment according to FIG. 9 is again a 1:1 imaging system and is derived from the embodiment according to FIG. 8.

TABLE 5

System corrected for COMA, astigmation and spherical aberration

| first imaging mirror 5 | Hyberbola | second imaging mirror 7 | Ellipse |
|---|---|---|---|
| $\alpha_2$ | 8.9395 | $\alpha_3$ | 6.4304 |
| $\delta_2$ | 1.9988 | $\delta_3$ | 20.5977 |
| $\omega_2$ | 15.8802 | $\omega_3$ | 33.4585 |
| $d_2$ = YDE | 283.1433 | $d_3$ = YDE | 587.5428 |
| a2 | 5949.4780 | a3 | 1371.5001 |
| b | 2942.2505 | b | 1329.5276 |
| e | 6637.2529 | e | 336.7028 |
| R | −1455.0585 | R | −1288.8396 |
| eps = e/a | 1.1156 | eps = e/a | 0.2455 |
| K = −eps^2 | −1.2446 | K = −eps^2 | −0.0603 |
| ZDE | 29.4941 | ZDE | 143.7641 |

The image plane 9 comprising the reticle is tilted with respect to the chief ray by 6°-angle of incidence. For a minimized spot aberration also the object plane 3 has to be tilted. In the example the optimized tilt angle of the object plane 3, where the field stop or rema has to be placed, is approximately 0.9768°.

Also shown in FIGS. 8 and 9 are the complete first hyperbolic imaging 5 and the complete second elliptic imaging mirror 7 of the imaging system with the first axis of rotation 50 and the second axis of rotation 52. As is apparent from FIG. 9 the rays impinging the mirrors of the imaging system off-axis; this means that the used area of the two mirrors are situated off-axis with regard to the axis of rotation of the two mirrors. Also clearly shown the angle γ between the two axis of rotation.

In FIG. 10 an even better performing imaging system than the system according to FIG. 8 is shown. The same reference numbers as for the system according to FIG. 9 are used. The system according to FIG. 10 is derived from a more balanced optimization. This time the magnification is β≈−0,85.

The limiting aberrations in the imaging system according to the invention is COMA and astigmatism.

For field imaging a mirror 5 near to conjugate pupil plane 42 is used. This mirror 5 is aimed not to affect pupil imaging. If one looks at the aberrations in a plane which contains the focus, for field points different from the focus there are field aberrations. That is the case of the hyperbola, which is actually limited by astigmatism. For a given field of view size the smaller the tilt angle of the hyperbola, the smaller the angle of the field objects and, therefore, the smaller the astigmatism.

An elliptical mirror 7 is chosen for pupil imaging. The ellipse case is more complicated because the parameters are found to give stigmatic imaging at the centre of the exit pupil, not in the field plane 7. When used off axis for other conjugates different than the two geometrical foci, the ellipse introduces coma, and this is what can be seen in the field plane 7. Once more, the way of reducing this coma is minimising the tilt and balancing COMA between the first mirror 5 and the second mirror 7 of the imaging system.

The spot diagrams for the centre field point 100 and an edge field point 102 for a system according to FIG. 10 are depicted in FIGS. 10.1 and 10.2. As is apparent from FIG. 10.2 the edge sharpness EDS for an edge field point is better than 1 mm in the scanning direction as well as in the direction perpendicular to the scanning direction. Said embodiment is a prefered embodiment since the required imaging performance of the imaging system is also achieved in the direction perpendicular to the scanning direction; here in the x-direction.

The data of the system according to FIG. 10 are given in Code-V-format in table 6.

TABLE 6

Code V-table of a imaging system with $\beta = -0.85$

| ! | Radius | distance to next surface | Surface typ | | | |
|---|---|---|---|---|---|---|
| S0 | 0 | 0 | DAR; | ADE | 6, 0; | |
| S | 0 | −369.481 | REFL | | | |
| S | 0 | −110.093 | | | | |
| S | 6964.67 | 0 | REFL | ! | first imaging mirror 5 | |
| | CON | | | | | |
| | K | −205.127 | | | | |
| | DAR; | | | ADE | −19.23631; | |
| | | | | YDE | 149.7571; ZDE | 50.40653 |
| S | 0 | 0 | | | | |
| | | | | ADE | −36.0; | |
| S | 0 | 500.9524 | | | | |
| S | 0 | 0 | | | | |
| | | | | ADE | 10.0; | |
| S | −898.3867 | 0 | REFL | ! | Second imaging mirror 7 | |
| | CON | | | | | |
| | K | −0.2302684 | | | | |
| | DAR; | | | ADE | 5.464502; | |
| | | | | YDE | 164.4807; ZDE | −0.638 |
| | CIR | 1000 | | | | |
| S | 0 | −797 | | | | |
| S | 0 | 0 | REFL | | | |
| | BEN; | | | ADE | −6.0; | |
| | CIR | 500 | | | | |
| SI | 0 | 0 | | !Reticle | | |
| | DAR | | | ADE | 6.0 | |

In FIG. 11 a EUV-illumination system with a ripple-plate 200 as field-forming component and an multi-mirror-system comprising an imaging system 1 according to the invention is shown. The system comprising a light source 12, a collector unit 14, a ripple-plate 200 as a field-forming component for the arc-shaped field and a field mirror (202) is known from Henry N. Chapman et al. a.a.O; the content of said article is incorporated herein by reference.

The imaging system shown in FIG. 11 is identical to the imaging systems according to FIGS. 1 to 10. The same elements as in FIGS. 1 to 10 are designated with the same reference numbers.

Other setups then those of FIG. 11 are possible, in which the light is not collimated before the ripple plate 200, but converging to a focal point. in this case the grooves of the ripple plate are not parallel, but conically, i.e. the prolongation of the grooves meet in one point corresponding to the focal point of the incident wave.

The shape of the ripple plate 200 can be derived theoretically, but has to be optimized. The pupil formation with the ripple design leads to an elliptical illumination of the exit pupil after the illumination system corresponding to the entrance pupil of the lens system. Therefore an aperture stop is required in a conjugate pupil plane. This aperture stop will also lead to light loss. The ellipticity of the pupil increases with the lateral coordinate, along the arc field perpendicular to scanning direction. The light loss has to be compensated for by shaping the ripple plate aspherically.

Next, two examples of hyperbola—ellipsoid-combinations for the imaging mirrors 5, 7 are shown with $\beta = -1.5$. The first order system is analytically derived, as described before. The second system is optimized for a better performance in scanning direction. The parameters are given in tables 7 to 9:

TABLE 7

First-order parameters for $\beta_{rema} = -1.5$ - system.

| first imaging mirror 5 | Hyberboloid | second imaging mirror 7 | Ellipsoid |
|---|---|---|---|
| | e 23 | | |
| $f_2$ | 495.9484 | 650.00 $f_3$ | 721.5351 |
| | pupil imaging | | |
| SE2 | −271.5174 | SE3 | −1250.0000 |
| SE2' | −600.0000 | SE3' | 1706.6772 |
| $\beta_2$ | 2.2098 | $\beta_3$ | −1.3653 |
| | field imaging | | |
| SR2 | −482.9048 | SR3 | −19011.2108 |
| SR2' | −18361.2108 | SR3' | 750.0000 |
| $\beta_2$ | 38.0224 | $\beta_3$ | −0.0395 |

If one corrects the coma of the system of table 7 according to analytic solution of ellipsoid and hyperboloid, as shown before, a system as shown in table 8 and FIG. 12 results. The spot aberrations are shown in FIG. 12.1 and FIG. 12.2 for a centre field point 100 and an edge field point 102.

TABLE 8

COMA corrected system

| first imaging mirror 5 | | second imaging mirror 7 | |
|---|---|---|---|
| $\alpha_2$ | 8.4600 | $\alpha_3$ | 6.5000 |
| $\delta_2$ | 0.4278 | $\delta_3$ | 29.9146 |
| $\omega_2$ | 16.4922 | $\omega_3$ | 42.9146 |
| $d_2$ = YDE | 137.04894 | $d_3$ = YDE | 851.1340 |
| $\alpha_2$ | 8939.1530 | $\alpha_3$ | 1478.3386 |
| b | 2945.3024 | b | 1441.2091 |
| e | 9411.8682 | e | 281.9172 |
| R | −970.4282 | R | −1424.5774 |
| eps = e/a | 1.0529 | eps = e/a | 0.1907 |

TABLE 8-continued

COMA corrected system

| first imaging mirror 5 | | second imaging mirror 7 | |
|---|---|---|---|
| K = -eps^2 | -1.1086 | K = -eps^2 | -0.0364 |
| ZDE = z - a | 9.9779 | ZDE = a - z | 280.9593 |

The embodiment according to FIG. 13 and table 9 is optimized to achieve spot aberration less than 1 mm in scanning direction:

TABLE 9

Optimized design

| first imaging mirror 5 | | second imaging mirror 7 | |
|---|---|---|---|
| $\alpha_2$ | 8.0302 | $\alpha_3$ | 6.2127 |
| $\delta_2$ | 0.1706 | $\delta_3$ | 30.3800 |
| $\omega_2$ | 16.2310 | $\omega_3$ | 42.8054 |
| d = YDE | 139.9744 | d = YDE | 848.9438 |
| R | -967.1380 | R | -1415.0130 |
| K = -eps^2 | -1.1933 | K = -eps^2 | -0.04913 |
| ZDE = z - a | 11.3839 | ZDE = a - z | 284.2995 |

In the following section an illumination system with an arbitrary field, e.g. a rectangular field in the object plane 3 is discussed. The schematic set-up for such systems are shown in FIGS. 14 and 15. In both examples the imaging system images a rectangular field 300 into an arc-shaped field 302. Consequently arc-shaped rema blades or field stop 304 have to be applied to compensate for the deformation induced by the imaging with grazing incidence field mirror 306 as shown in FIG. 16. Furthermore in FIG. 16 the clipping 308 in the image or rema-plane 9 is shown.

The system according to FIGS. 14 and 15 comprises: an object plane 3 at least, a first imaging normal incidence mirror 5 and at least one grazing incidence mirror 306 for forming the arc-shaped field in the image plane 9.

A realization of a system with one grazing incidence mirror 306 is given in FIG. 17. To achieve the desired orientation for the ring field, a field lens with negative optical power is required. The radius of the arc-shaped field is approximately 138 mm, however, by the angle of incidence and the optical power of the first imaging mirror 5 almost any desired field radius is achievable. Table 10 gives the data for such a system, where for the magnification $\beta_{image}$=-1.2 was chosen.

TABLE 10

| first imaging mirror 5 | ellipsoid | grazing imaging mirror 306 | hyperboloid |
|---|---|---|---|
| $\alpha_1$ | 12.0 | $\alpha_2$ | 78.0 |
| | e 23 | | 500.00 |
| $f_1$ | 382.1450 | $f_2$ | -868.3020 |
| pupil imaging | | | |
| SE1 | -609.7360 | SE2 | 523.8000 |
| SE1' | 1023.8000 | SE2' | 1320.2146 |
| $\beta_1$ | -1.6791 | $\beta_2$ | 2.5205 |
| field imaging | | | |
| SR1 | -810.6258 | SR2 | 222.9651 |
| SR1' | 722.9651 | SR2' | 300.0000 |
| $\beta_1$ | -0.8919 | $\beta_2$ | 1.3455 |
| surface parameters | | | |
| $\delta_1$ | 27.9820 | $\delta_2$ | 14.2042 |
| $\omega_1$ | 51.9820 | $\omega_2$ | 38.2042 |
| e | 264.2854 | e | 434.1220 |
| d | 480.3602 | d | 323.9526 |
| b | 772.8280 | b | 172.8956 |
| a | 816.7680 | a | 398.2073 |
| p = R | -731.2519 | p = R | 75.0687 |
| eps | 0.3236 | eps | 1.0902 |
| K | -0.1047 | K | -1.1885 |
| z | 639.8277 | z | 845.7300 |

The arcuate field is demonstrated in FIG. 17.1. A rectangular aperture was ray-traced through the system until the reticle plane. Here the arc-shaped field arises due to the grazing incidence reflection at the grazing incidence mirror 306. However, the spot diameter is in this un-optimized example about 10 mm. Due to the imaging with one normal incidence and one grazing incidence mirror, a large amount of coma is introduced, which can not be reduced effectively.

A reduction of coma is possible by insertion of a second normal incidence mirror 7. An example is shown in FIG. 18, the corresponding data are given in table 11 (with $\beta_{image}$≈-1.272). The illumination at reticle field is shown in FIG. 18.1. The system has capability to be optimized further to similar performance as system examples given before by similar straight forward optimization, which means proper selection of reflection and folding angles.

TABLE 11

| first imaging mirror 5 | ellipsoid | second imaging mirror 7 | hyperboloid | grazing incidence mirror | hyperboloid |
|---|---|---|---|---|---|
| $\alpha_0$ | 8.0 | $\alpha_1$ | 11.0 | $\alpha_2$ | 12.0 |
| | e 01 | | e12 | | 500.000 |
| $f_0$ | 686.2745 | $f_1$ | 1055.0641 | $f_2$ | -868.302 |
| pupil imaging | | | | | |
| $SE_0$ | -700.0360 | $SE_1$ | 3455.9 | $SE_2$ | 523.8 |
| $SE_{0'}$ | 35000.0 | $SE_{1'}$ | 1023.8 | $SE_{2'}$ | 1320.2146 |
| $\beta_0$ | -50.0 | $\beta_1$ | 0.0296 | $\beta_2$ | 2.5205 |
| field imaging | | | | | |
| $SR_0$ | -914.8405 | $SR_1$ | 2296.8290 | $SR_2$ | 222.9651 |
| $SR_{0'}$ | 2746.8290 | $SR_{1'}$ | 722.9851 | $SR_{2'}$ | 300.0 |
| $\beta_0$ | -3.0025 | $\beta_1$ | 0.3148 | $\beta_2$ | 1.3455 |

TABLE 11-continued

| first imaging mirror 5 | ellipsoid | second imaging mirror 7 | hyperboloid | grazing incidence mirror | hyperboloid |
|---|---|---|---|---|---|
| $\delta_0$ | 7.6903 | $\delta_1$ | 21.3810193242 | $\delta_2$ | 14.2042 |
| $\omega_0$ | 23.6903 | $\omega_1$ | 0.6189806758 | $\omega_2$ | 38.2042 |
| b | 1569.789 | b | 5838.1891964484 | b | 172.8956 |
| a | 1830.8348 | a | 16763.1000000000 | a | 398.2073 |
| p = R | −1345.9639 | p = H | −2033.3024973619 | p = R | −75.0687 |
| eps | 0.5146 | eps | 1.0589128053 | eps | 1.0902 |
| K | −0.2448 | K | −1.1212963293 | K | −1.1885 |
| e | 942.1881 | e | 17750.6612469375 | e | 434.122 |
| d | 387.5783 | d | 373.24505478583 | d | 323.9528 |
| z | 1779.9358 | z | −16797.3226034857 | z | 845.73 |

REFERENCE NUMBERS:

| | |
|---|---|
| 1: | imaging system |
| 3: | object plane = field plane |
| 3': | virtual image of the field plane |
| 5: | first imaging mirror |
| 9: | image plane |
| 10: | exit pupil |
| 10': | virtual image of the exit pupil |
| 12: | light source |
| 14: | collector |
| 16: | means for enhancing the entendu |
| 18: | first field forming mirrors |
| 20: | second field forming mirrors |
| 30: | first mirror with raster elements |
| 32: | second mirror with raster elements |
| 40: | first plane conjugate to the exit pupil |
| 42: | second plane conjugate to the exit pupil |
| 50: | axis of rotation of the first imaging mirror |
| 52: | axis of rotation of the second imaging mirror |
| 54: | centre of the first imaging mirror |
| 56: | vertex of the first imaging mirror |
| 58: | centre of the second imaging mirror |
| 60: | vertex of the second imaging mirror |
| 62: | chief ray |
| 70: | lower COMA ray |
| 100: | field point in the centre of the arc shaped field |
| 102: | field point at the edge of the arc shaped field |
| 200: | ripple plate |
| 300: | rectangular field |
| 302: | arc shaped field |
| 304: | field stop |
| 306: | grazing incidence mirror |
| 308: | clipping |
| ePO: | distance between first mirror and first plane conjugate to the exit plane |
| e01: | distance between first and second field forming mirror |
| EDS: | edge shapness |
| SE1': | distance between second field forming mirror and second plane conjugate to the exit pupil |
| SR1': | distance between second field forming mirror and object plane |
| SE2: | distance between second plane conjugate to the exit pupil and first imaging mirror |
| x: | direction perpendicular to the scanning direction |
| y: | direction in scanning direction |
| γ: | angle between the axis of rotation 50, 52 |
| $f_i$: | focal length of optical component i |
| $\alpha_i$: | angle of incidence of chief ray with respect of surface normal of mirror i |
| $\beta_{pupil}$: | magnification for pupil imaging between conjugate pupil planes |
| $\beta_{field}$: | magnification for field imaging between conjugate field plane and reticle plane |
| $\beta_i$: | magnification for the intermediate imaging at a single optical element, either for pupil or for field imaging (depending on context) |
| R: | field radius |
| S: | working distances |
| SEi: | working distance with respect to entrance pupil imaging between mirror i on object side |
| SEi': | working distance with respect to entrance pupil imaging between mirror i on image side |
| SRi: | working distance with respect to field imaging between mirror i on object side |
| SRi': | working distance with respect to field imaging between mirror i on image side |
| eij: | distance between optical element i and j |
| $\omega_i$: | angle between incident chief ray and rotation axis of optical element i |
| $\delta_i$: | angle between reflected chief ray and rotation axis of optical element i |
| a, b, e, ε, p, K: | conic section parameters for individual mirror |
| $d_i$: | transversal co-ordinate of intersection point of chief ray with mirror i with respect to rotation axis |
| $z_i$: | longitudinal co-ordinate of intersection point of chief ray with mirror i with respect to centre of conic section |
| $\beta_{c\pm}$: | magnification for upper or lower coma or rim rays |
| YDE, ZDE: | decenter vector components as usual in optical design programs (e.g. CODE V). |

What is claimed is:

1. A multi-mirror system for an illumination system for lithography with wavelengths≦193 nm, said multi-mirror system comprising an imaging system having:

an object plane;

an image plane in which said imaging system forms an image of an object;

an arc-shaped field in said image plane;

a normal incidence mirror in an optical path from said object plane to said image plane; and a field forming optical component in said path after said normal incidence mirror for producing said arc-shaped field, wherein said field forming optical component includes a grazing incidence mirror having negative optical power.

2. The multi-mirror system of claim 1, wherein said object is an arbitrary field in said object plane.

3. The multi-mirror system of claim 2, wherein said arbitrary field is a rectangular field, and said rectangular field is formed into said arc-shaped field by said field forming optical component.

4. The multi-mirror system of claim 2, wherein said arbitrary field is imaged by said imaging system and has a magnification ratio unequal to 1.

5. The multi-mirror system of claim 1, wherein said normal incidence mirror is a first normal incidence mirror, and wherein said imaging system further comprises a second normal incidence mirror in said optical path between said first normal incidence mirror and said field forming optical components.

6. The multi-mirror system of claim 1, further comprising a field stop located in said object plane.

7. The multi-mirror system of claim 1, wherein said normal incidence mirror is aspheric.

8. The multi-mirror system of claim 1, wherein said field forming optical component is positioned close to said image plane.

9. The multi-mirror system of claim 1, wherein said normal incidence mirror defines an axis of rotation, wherein said normal incidence mirror, and said grazing incidence mirror each have a used area upon which a ray traveling through said imaging system impinges, and wherein said used area of said normal incidence mirror, and said used area of said grazing incidence mirror are off-axis with respect to said axis of rotation.

* * * * *